(12) United States Patent
Mawet

(10) Patent No.: US 6,859,762 B2
(45) Date of Patent: Feb. 22, 2005

(54) LOW VOLTAGE LOW POWER SIGNAL PROCESSING SYSTEM AND METHOD FOR HIGH ACCURACY PROCESSING OF DIFFERENTIAL SIGNAL INPUTS FROM A LOW POWER MEASURING INSTRUMENT

(75) Inventor: Patrick H. Mawet, Snohomish, WA (US)

(73) Assignee: Mitutoyo Corporation, Kanagawa-ken (JP)

(*) Notice: Subject to any disclaimer, the term of this patent is extended or adjusted under 35 U.S.C. 154(b) by 60 days.

(21) Appl. No.: 09/898,674

(22) Filed: Jul. 3, 2001

(65) Prior Publication Data

US 2003/0018452 A1 Jan. 23, 2003

(51) Int. Cl.$^7$ .............................................. H03K 13/02
(52) U.S. Cl. ........................ 702/189; 702/193; 702/194; 702/106; 702/57; 702/64; 340/870.31
(58) Field of Search ................... 702/189, 193–195, 702/106, 57, 64, FOR 106, FOR 135, FOR 110; 341/118, 120, 155, 143, 158, 169, 170, 138, 159; 324/207.12, 207.19, 207.23, 207.24; 340/870.31, 870.35, 870.39; 323/207, 233; 363/65

(56) References Cited

U.S. PATENT DOCUMENTS

| | | | |
|---|---|---|---|
| 3,665,305 A | * 5/1972 | Petrohilos | .................. 324/99 D |
| 3,725,905 A | * 4/1973 | Tunzi | .......................... 341/136 |
| 3,831,113 A | 8/1974 | Ahmed | |
| 3,886,485 A | 5/1975 | Takahashi | |
| 3,921,101 A | 11/1975 | McCoy et al. | |
| 3,995,232 A | 11/1976 | Laugesen | |
| 4,020,487 A | * 4/1977 | Winter | ....................... 341/170 |
| 4,031,533 A | * 6/1977 | Neumann | .................... 341/167 |
| 4,115,748 A | 9/1978 | Kubo et al. | |

(List continued on next page.)

FOREIGN PATENT DOCUMENTS

DE     199 45 949 A1     3/2001

OTHER PUBLICATIONS

Johns, D. and K. Martin, *Analog Integrated Circuit Design*, John Wiley and Sons, Inc., 1997, "Advanced Current Mirrors and Opamps" and "Comparators.".

*Primary Examiner*—Marc S. Hoff
*Assistant Examiner*—Carol S Tsai
(74) *Attorney, Agent, or Firm*—Christensen O'Connor Johnson Kindness PLLC

(57) ABSTRACT

A low voltage low power signal processing system and method for use in low power and/or portable measuring instruments such as linear or rotary encoders, electronic calipers and the like. In one embodiment, the analog-to-digital converter is implemented as a parallel, single ramp, with two matched comparators for each leg of differential input, which can be implemented with relatively simple circuitry, and consequently be of a small size. The system may be used with a three-phase transducer configuration, for which the preferred signal processing techniques are able to cancel most of the third harmonic distortion in the system, and for which the fully differential signal processing methods of the invention are advantageous. The invention may be used in a portable measuring instrument that operates from a single 1.5 volt watch battery or solar cell, and that has a current drain of 5 microamps. By using capacitors of the same type in the ramp generator and clock generator, and charging them with scaled bias currents, and by using resistors and capacitors of the same type in the clock and analog-to-digital converter, the scale factor of the system is made to be independent of process parameters.

29 Claims, 11 Drawing Sheets

U.S. PATENT DOCUMENTS

| | | | |
|---|---|---|---|
| 4,205,279 A | | 5/1980 | Beutler |
| 4,264,898 A | * | 4/1981 | Barman et al. .............. 341/141 |
| 4,283,690 A | | 8/1981 | Tarbouriech |
| 4,370,628 A | | 1/1983 | Henderson et al. |
| 4,377,790 A | | 3/1983 | Zobel et al. |
| 4,514,476 A | * | 4/1985 | Fitzgerald .................... 429/94 |
| 4,550,611 A | * | 11/1985 | Czarnocki .................... 73/708 |
| 4,675,651 A | * | 6/1987 | Marbot et al. .............. 341/135 |
| 4,762,132 A | * | 8/1988 | Nicolas et al. ................. 600/442 |
| 4,939,518 A | * | 7/1990 | Hotta et al. ................. 341/159 |
| 5,214,430 A | * | 5/1993 | Gulczynski ................. 341/120 |
| 5,345,195 A | | 9/1994 | Cordoba et al. |
| 5,459,427 A | * | 10/1995 | Chambers et al. .......... 327/333 |
| 5,499,028 A | | 3/1996 | Kuwano et al. ............ 341/159 |
| 5,528,182 A | | 6/1996 | Yokosawa |
| 5,689,167 A | * | 11/1997 | Vitunic ....................... 318/767 |
| 5,781,051 A | | 7/1998 | Sandhu |
| 5,877,718 A | * | 3/1999 | Andoh et al. ............... 341/155 |
| 5,886,519 A | | 3/1999 | Masreliez et al. |
| 5,901,458 A | | 5/1999 | Andermo et al. |
| 5,982,318 A | | 11/1999 | Yiannoulos |
| 6,011,389 A | * | 1/2000 | Masreliez et al. ..... 324/207.17 |
| 6,144,330 A | | 11/2000 | Hoffman et al. |
| 6,177,901 B1 | | 1/2001 | Pan et al. |
| 6,232,908 B1 | * | 5/2001 | Nakaigawa ................. 341/160 |
| 6,508,122 B1 | * | 1/2003 | McCall et al. ........... 73/504.12 |
| 6,518,909 B1 | * | 2/2003 | Yang et al. ................. 341/155 |
| 2001/0052869 A1 | * | 12/2001 | Singer et al. ............... 341/156 |
| 2002/0149780 A1 | * | 10/2002 | Trinh ......................... 356/477 |

* cited by examiner

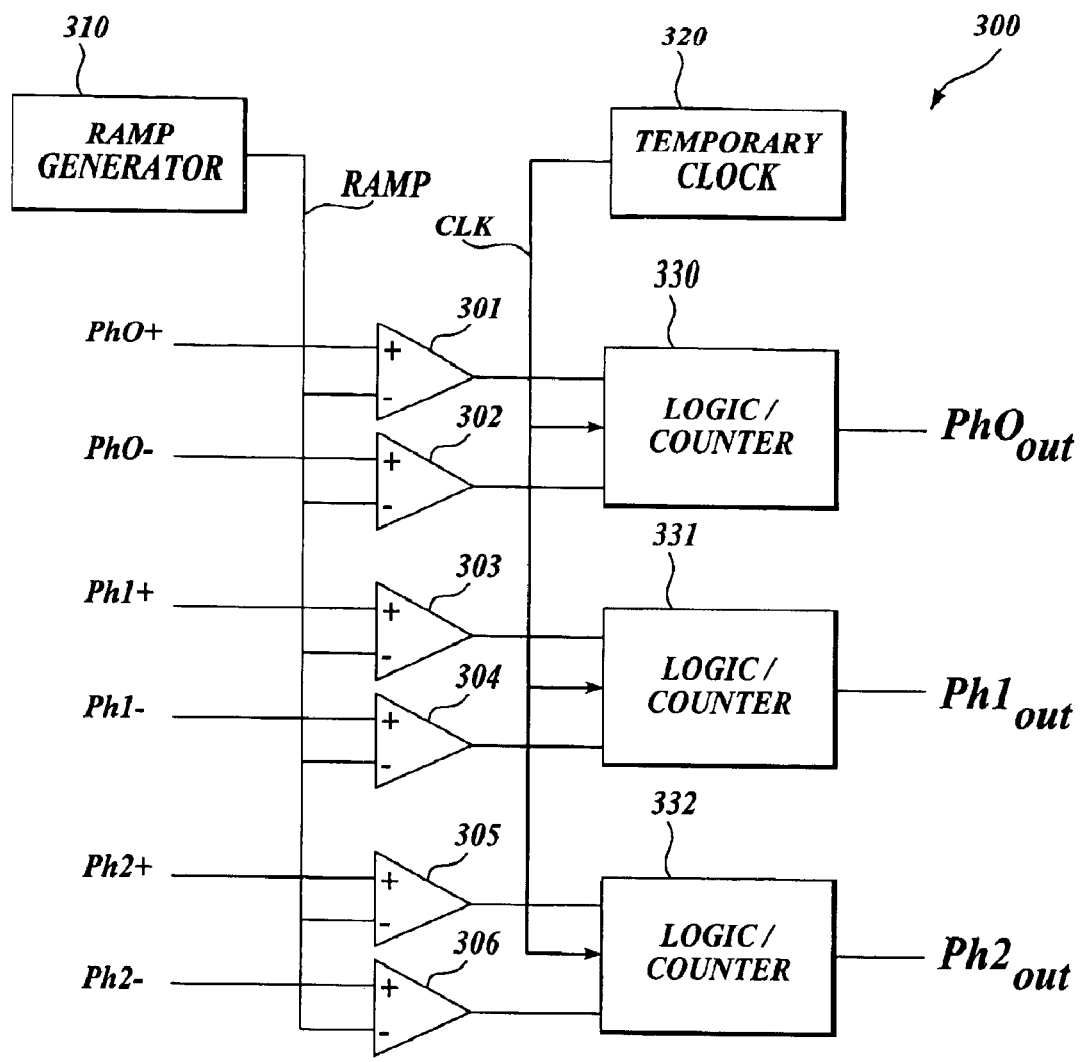
Fig. 6.
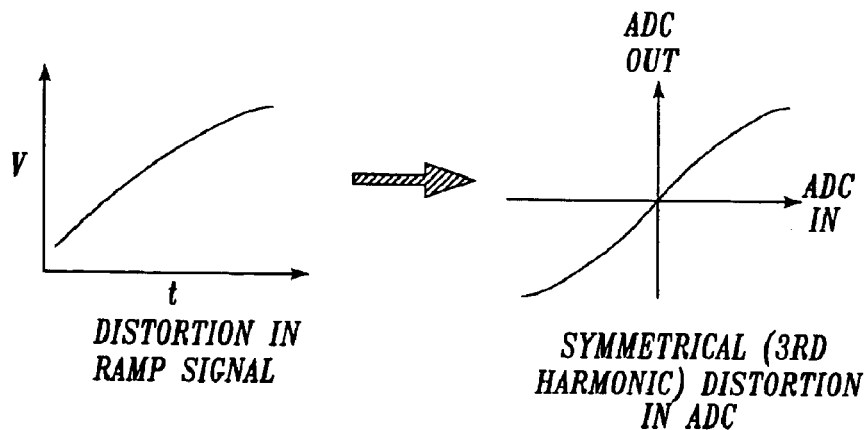
Fig. 7A. DISTORTION IN RAMP SIGNAL
Fig. 7B. SYMMETRICAL (3RD HARMONIC) DISTORTION IN ADC

LOW VOLTAGE LOW POWER SIGNAL PROCESSING SYSTEM AND METHOD FOR HIGH ACCURACY PROCESSING OF DIFFERENTIAL SIGNAL INPUTS FROM A LOW POWER MEASURING INSTRUMENT

FIELD OF THE INVENTION

The present invention relates to low power electronic measuring instruments and, more particularly, to a low voltage low power signal processing system and method for high accuracy processing of differential signal inputs from sensors included in portable and/or low power measuring instruments such as electronic calipers, linear or angular position gauges, tilt or level gauges, pressure gauges and the like.

BACKGROUND OF THE INVENTION

Various portable electronic measuring instruments are currently available. One example of such an instrument is a displacement measuring instrument, a hand-held electronic caliper which can be used for making precise measurements of machined parts to ensure that they are meeting tolerance requirements. It is obvious that the less power such instruments use, the fewer batteries (or other power sources) they will require and the longer they will operate before the batteries (or other power sources) need to be replaced or replenished. However, reducing the power requirements of such devices is a complex task. Such devices are required to make highly accurate measurements, and the complex signal processing techniques that have been developed for such devices tend to complicate the process of designing circuitry that will both accomplish the desired accuracy and operate at low voltage and power levels.

An example of an electronic caliper using highly accurate measuring techniques is shown in U.S. Pat. No. 5,901,458, which is commonly assigned and hereby incorporated by reference in its entirety. As described, the electronic caliper has a reduced offset position transducer that uses a read head that is movable along a scale. The electronics provide a precise measurement of the read head's position on the scale. The transducer uses two sets of coupling loops on the scale to inductively couple a transmitter winding on the read head on a slide to one or more receiver windings on the read head. The transmitter winding generates a primary magnetic field. The transmitter winding is inductively coupled to first loop portions of first and second sets of coupling loops by a magnetic field. Second loop portions of the first and second sets of coupling loops are interleaved and generate secondary magnetic fields. A receiver winding is formed in a periodic pattern of alternating polarity loops and is inductively coupled to the second loop portions of the first and second sets of coupling loops by the secondary magnetic fields. Depending on the relative position between the read head and the scale, each polarity loop of the receiver winding is inductively coupled to a second loop portion of either the first or second set of coupling loops. The relative positions of the first and second loop portions of the first and second sets of coupling loops are periodic and dependent on the relative position of the coupling loops on the scale.

Another example is shown in U.S. Pat. No. 5,886,519, which is commonly assigned, and incorporated herein by reference in its entirety. The '519 patent discloses an inductive absolute position transducer for high accuracy applications, such as linear or rotary encoders, electronic calipers and the like. The absolute position transducer uses two members movable relative to each other. The first member contains at least one active transmitter for generating a magnetic field and at least one receiver for receiving the generated magnetic field. The passive second member includes passive flux modulating elements that modulate the received field depending on their position relative to the at least one receiver. An electronic circuit coupled to the at least one transmitter and the at least one receiver compares the outputs of the at least one receiver, evaluates the absolute position between the two members, and exhibits the position on a display. The inductive absolute position transducer determines the absolute position between the two members.

Systems such as those shown in the '458 and '519 patents utilize advanced signal processing techniques to produce highly accurate displacement measurements. The present invention is directed to a portable electronic measuring instruments, and especially to portable electronic displacement measuring instruments, that produces highly accurate measurements while using a low voltage low power system.

SUMMARY OF THE INVENTION

The present invention provides a low voltage low power signal processing system and method for use in portable measuring instruments such as electronic calipers linear or angular gauges, level gauges, pressure gauges and the like. As part of the low voltage low power system and method, a conversion process is performed such as an analog-to-digital conversion which utilizes a time-varying reference signal such as a ramp signal to produce timing measurements that are used to determine the digital outputs of the conversion.

The accuracy of the advanced transducers and signal processing methods that are used in portable measuring instruments such as electronic calipers and the like is often dependent on producing a precisely linear conversion of the measured input quantity to a useful form of output, thus, it is desirable to avoid the production of second order distortion in such systems. Second order distortion can occur if differential signals are converted to single-ended signals, such as is done when using conventional time-varying reference signal conversion methods. The present invention utilizes a time-varying reference signal method for the conversion processing and yet avoids the production of second order distortion by not converting the signals to a single-ended format, and instead providing circuitry for processing the signals as differential signals.

The system of the invention may be used with transducers which output multiple signals in parallel, for example in a three-phase transducer configuration. The preferred signal processing techniques for the three-phase configuration are able to cancel most of the third harmonic distortion in the system. Thus, the fully differential circuits of the invention are advantageous in such systems because the third harmonic error cancellation inherent to the three-phase technology is perfectly complemented by the second harmonic error suppression of the fully differential circuits. These techniques minimize the distortion-related errors present in the final measurement values determined according to the systems and methods of this invention, even with the limitations imposed by the low power and voltage supply requirements. Also, the techniques provide for simple circuits that minimize distortion-related errors.

In accordance with one aspect of the invention, the analog-to-digital converter is implemented as a parallel, single ramp, with two matched comparators for each leg of differential input. Therefore, in an embodiment with a three-phase transducer, there would be six inputs from the three phases which would be provided to six comparators. One of the inputs of each of the comparators receives the differential signals, while the other input of each of the comparators receives the ramp signal.

The ramp analog-to-digital converter of the present invention can be implemented with relatively simple circuitry, and consequently be of a small size and operable from low voltage. An operating speed limitation of the system is due to the nature of the ramp itself, since a ramp inherently takes time to transition. However, since high-speed operation is not a critical factor in the signal processing of a variety of portable or handheld measuring instruments (e.g., electronic calipers), this implementation provides an effective tradeoff of a slower system for one that uses less power, is of a smaller size and is operable from low voltage. For the sampling speed of the many portable measuring systems, a primary consideration is making the samples frequent enough to avoid flickering on a display that can be detected by the human eye. In one embodiment, a sampling rate in excess of 10 samples per second (thus having a processing time per sample of about 100 ms) is sufficient to address this consideration.

In accordance with another aspect of the invention, the analog-to-digital converter of the present invention may be used in a portable measuring instrument that is operable from a power supply providing a voltage less than 1.75 volts (e.g., a single 1.5 volt watch battery or solar cell), and has a current drain compatible with portable measuring instruments which require an overall current drain as low as 5 microamps. Thus, this embodiment would satisfy system requirements as low as 1.5 volts nominal (1.35 volts minimum). The system of the present invention minimizes the current drain and maximizes the dynamic range of the analog circuits by using fully differential circuits, powering them from the 1.5 volt source, and further may use NMOS switches with voltage boosters. The invention is also advantageous in systems with voltages higher than 1.5 volts, such as one that is operable from a power supply providing a voltage less than 3.5 volts (e.g., two 1.5 volt watch batteries or solar cells in series). The invention is also advantageous in some applications operating with voltages higher than 3.5 volts.

In accordance with another aspect of the invention, certain components are selected to reduce the sensitivity of the overall system to process parameters. More specifically, by using capacitors of the same type in the ramp generator and clock generator, and charging them with scaled bias currents, and by using resistors and capacitors of the same type in the clock and analog-to-digital converter, the scale factor of the system is made to be independent of process parameters, as well as later environmental effects due to operating temperature, circuit aging, and the like. In addition, since the transducer signal will be proportional to the supply voltage, by deriving the reference voltage directly from the power supply (using a divider), the system's scale factor (peak-to-peak counts for each phase signal) will be made to be independent of the supply voltage variations, whatever their cause.

In accordance with another aspect of the invention, the comparators may be implemented in any way suitable for low voltage low power operation. Either a low power operational amplifier-type comparator or a dynamic comparator may be used. Comparators having a switched capacitor input have the advantage of storing the input voltage on the input capacitor, which allows the preceding stage of the analog signal processing circuitry to be turned off, thereby saving power and facilitating cancellation of the comparator offset. In general, since the comparators are identical, any delays and parasitic effects should not affect accuracy and the choice of the low voltage low power comparator design is not critical.

In accordance with another aspect of the invention, the counter that is used may be a ripple counter, which typically has a low current drain, since it minimizes the number of toggles. To minimize the number of registers, the count value is stored in the counter itself. It should also be noted that no subtraction circuit is needed. The sign signal is stored in a separate register. The end result of these design choices is a highly efficient circuit, both in terms of small size, low voltage operation and low current drain.

The analog-to-digital converter of the present invention also has a number of advantages with regard to the effects of leakage currents. One advantage is that the effect of leakage in the analog-to-digital converter comparators will be canceled, since the design is fully differential in nature. In addition, while voltage dependent leakage will introduce third order distortion, the third order distortion will not introduce position errors in the case of the above-described three-phase system. Furthermore, mismatches in leakage will have the same effect as any other mismatch, such as offset and scale factor mismatches between channels. This should be quite small (second order effect) and can be canceled by error correction.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 6 is a block diagram of an embodiment of the ramp analog-to-digital converter of FIG. 1;

FIG. 7A is a graph illustrating possible second order distortion in a ramp signal used in a ramp analog-to-digital converter;

FIG. 7B is a graph illustrating the possible symmetrical third order distortion in a ramp analog-to-digital converter;

DETAILED DESCRIPTION OF THE PREFERRED EMBODIMENTS

Figure 1:
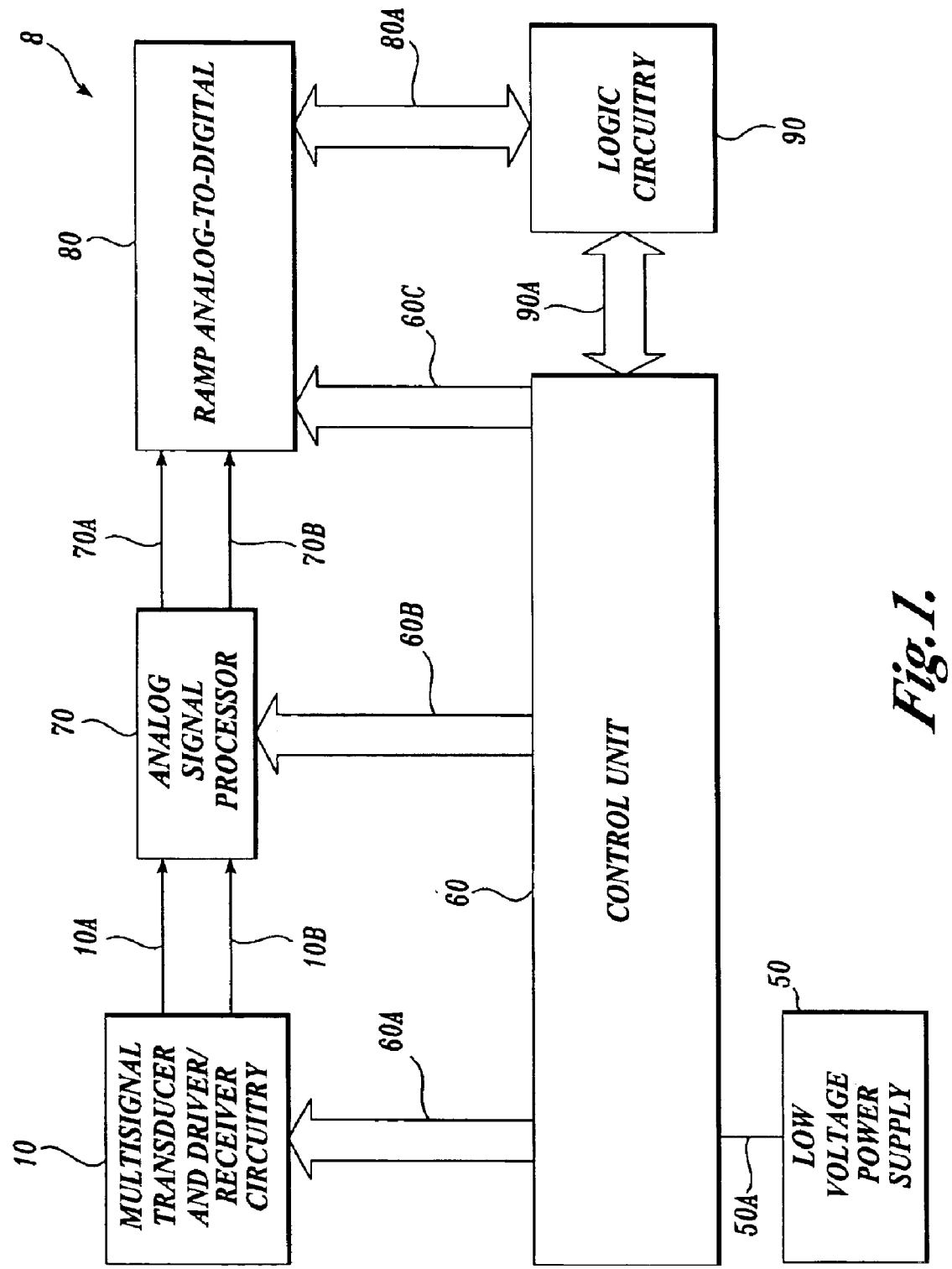
FIG. 1 is a block diagram of a measurement system using a ramp analog-to-digital converter in accordance with the present invention.

FIG. 1 shows a functional block diagram of a measurement system 8 using a ramp analog-to-digital converter 80 in accordance with the present invention. The ramp analog-to-digital converter 80 will be described in more detail below with reference to FIG. 6. In short, the ramp analog-to-digital converter provides a low voltage low power implementation that is able to produce highly accurate differential signal measurements.

As also shown in FIG. 1, the measurement system 8 includes a multi-signal transducer and driver/receiver circuitry 10, which outputs analog differential signals on signal lines 10A and 10B to the analog signal processor 70. The analog signal processor 70 outputs differential signals on signal lines 70A and 70B to the ramp analog-to-digital converter 80. As will be described in more detail below, the differential nature of the output signals is an important consideration in the design of the analog-to-digital converter 80. In summary, the use of the differential signals avoids the production of additional second order distortion which is commonly associated with single-ended signal processing of transducer output signals. Third order distortion is thus the primary distortion in the system. As will be described in more detail below, in various exemplary embodiments, signal processing techniques can then be used to cancel much of the third harmonic distortion from the system.

In conventional systems single-ended signals are typically used with low voltage low power analog-to-digital converters such as ramp converters. However, as will be described in more detail below, the conversion of the differential signals into single-ended signals typically produces significant amounts of second order distortion in the system. The introduction of second order distortion significantly reduces the accuracy of measuring systems. The method by which the ramp analog-to-digital converter 80 of the present invention processes the differential signals from the analog signal processor 70, and thus avoids the need to convert the signals to a single-ended format, will be described in more detail below with reference to FIG. 6. It should be appreciated that, in the prior art, many of the circuit design and accuracy problems mentioned previously, and discussed in greater detail further below, have been conventionally solved by adding circuit complexity. However, such conventional solutions are incompatible with the particularly low power low voltage operating requirements of a variety of portable and handheld measuring instruments. Thus, the reader should appreciate that the simplicity and other features of the design elements of the present invention, each separately and also together, provide particular benefit for highly accurate transducer signal processing in combination with the particularly low power low voltage operating requirements of a variety of portable and handheld measuring instruments.

The ramp analog-to-digital converter 80 outputs digital values over a data line 80A to a logic circuitry 90. Logic circuitry 90 provides and receives signals from a control unit 60 over a data and power bus 90A. In one embodiment, logic circuitry 90 comprises a hard wired logic circuit, as will be described in more detail below with reference to FIG. 8. However, it will be understood that the logic circuitry 90 could consist of a microprocessor, or any implementation of a suitable finite state machine as is known in the art. The control unit 60 also provides control signals over a data and power bus 60A to the multi-signal transducer and driver/receiver circuitry 10, control signals over a data and power bus 60B to the analog signal processor 70, and control signals over a data and power bus 60C to the ramp analog-to-digital converter 80. A low voltage power supply 50, may supply power to the entire measurement system 8 through one or more power lines 50A, the power further distributed through the various data and power buses of the system, and subject to the control of the digital control unit 60.

While FIG. 1 shows a functional block diagram for the measurement system 8, it will be appreciated that the measurement system 8 is presented as an exemplary embodiment. The low power low voltage systems and methods of this invention may be implemented in conjunction with a variety of transducer systems or other appropriate known or later developed precision measuring systems. Furthermore, it will be appreciated that the transducer in circuitry 10 may be implemented using any appropriate known or later developed multi-signal transducer, including, for example, the transducers disclosed in the incorporated '458 and '519 patents.

Figure 2:
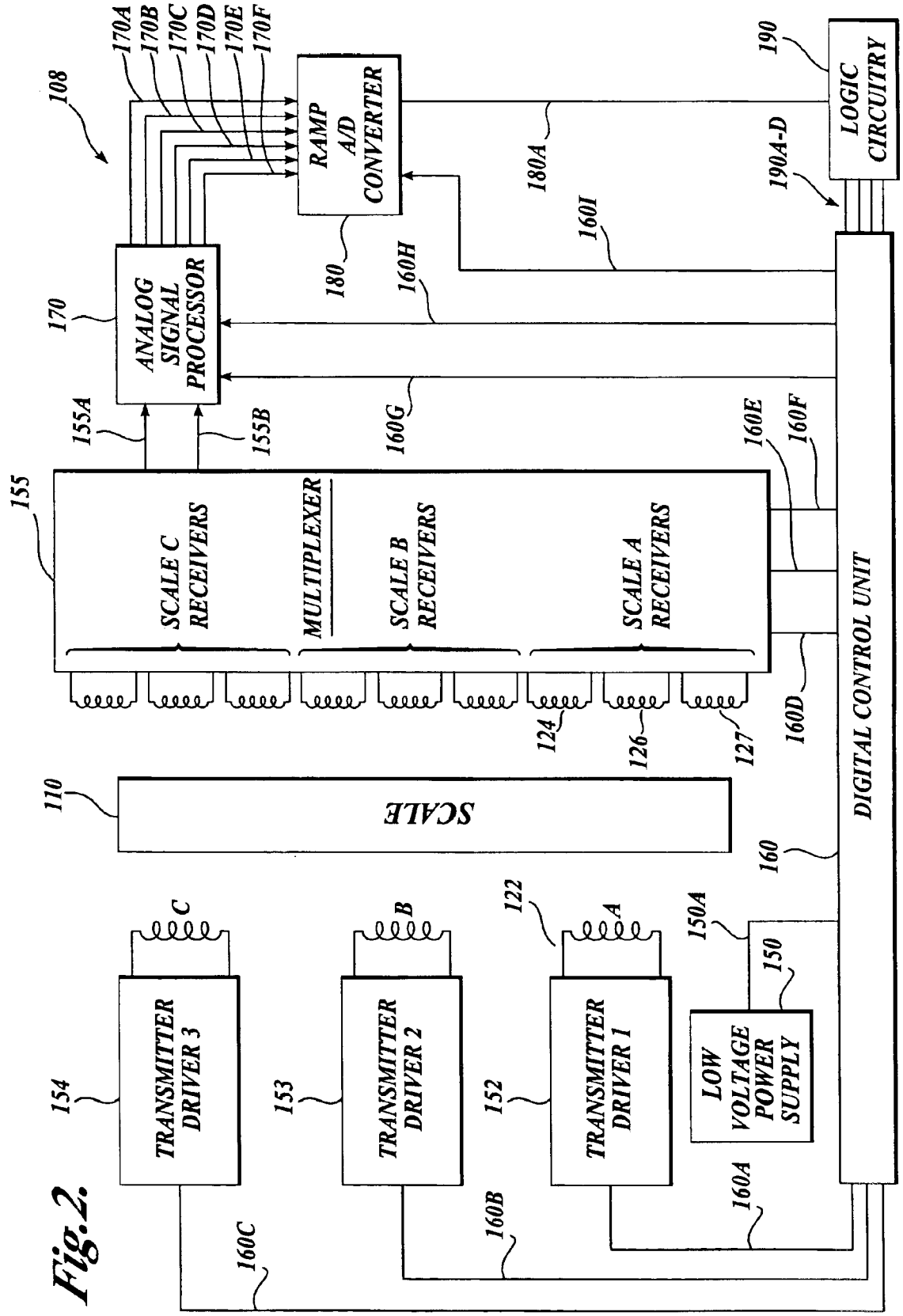
FIG. 2 is a block diagram of one embodiment of the measurement system of FIG. 1 using multiple three-phase transducer windings.

FIG. 2 shows a block diagram of one embodiment of the measurement system of FIG. 1, in which multiple three-phase transducer windings are used. FIG. 2 shows an example of a three-scale track design, where there are three sets of three-phase receiver windings. This three-scale track design is described in more detail in copending U.S. patent application Ser. No. 09/268,674, which is commonly assigned and hereby incorporated by reference in its entirety.

As shown in FIG. 2, the measurement system 108 includes a transmitter winding 122 that is connected to a transmitter driver circuit 152. The transmitter winding 122 is indirectly inductively coupled via coupling loops formed on a scale member of the induced current position transducer to the first, second, and third receiver windings 124, 126 and 127, which are connected to a multiplexer 155. The differential output of the multiplexer 155 is connected through lines 155A and 155B to an analog signal processor 170. The differential output of the analog signal processor 170 is provided on six output lines 170A to 170F to the input of an analog-to-digital converter 180. The analog-to-digital converter 180 converts the differential output of the analog signal processor 170 from an analog signal to a digital signal. The digital signal from the analog-to-digital converter 180 is output on a line 180A to a logic circuitry 190, which processes the digital signal from the analog-to-digital converter 180 to determine the relative position between the read head and the scale member 110.

Each position within a wavelength can be uniquely identified by the logic circuitry 190 according to known techniques and equations disclosed in the incorporated '458 and '519 patents. The logic circuitry 190 also controls the sequence of signal sampling by outputting a control signal over signal lines 190A–190D to a digital control unit 160. The digital control unit 160 controls the sequence of transmission, signal sampling and analog-to-digital conversion by outputting control signals on the power and signal bus lines 160A–160I to the transmitter drivers 152–154, multiplexer 155, the analog signal processor 170 and the ramp analog-to-digital converter 180.

In particular, as shown in FIG. 2, the digital control unit 160 outputs control signals over the power and signal bus lines 160A–160C to the transmitter drivers 152–154, respectively, to controllably excite the transmitter windings. The digital control unit 160 also outputs switch and control signals on the power and signal bus lines 160D–160F to the multiplexer 155. The control signals on lines 160D–160F determine which of the possible phases of the multi-scale-track, multi-phase receiver windings 124, 126 and 127 is input to the analog signal processing circuits 170 that follow the multiplexer 155. A low voltage power supply 150, may supply power to the entire measurement system 108 through one or more power lines 150A, the power further distributed through the various data and power buses of the system, and subject to the control of the digital control unit 160.

As noted above, FIG. 2 shows an example of a three-scale track design, where there are three sets of three-phase receiver windings. The multiplexer 155 will choose one signal, or in the case of differential measurements, one signal pair, to be output to the analog signal processor 170. The chosen signal, or signal pair, is then processed by the analog signal processor 170. The analog signal processor 170 is controlled by the control signals on lines 160G and 160H. The output of the analog signal processor 170 is provided on signal lines 170A–170F, which are input to analog-to-digital converter 180. The analog-to-digital converter 180 is controlled by the control signals on line 160I. The logic circuitry 190 can access the output of the analog-to-digital converter 180. Furthermore, because the logic circuitry 190 controls the operation of the digital control unit 160, the logic circuitry 190 can choose to select the scale tracks or phases in any sequential order.

As described in more detail in the incorporated '674 application, the above embodiment that describes signal multiplexing between the multiple phases of a single set of receivers will also apply equally well to the multiplexing between the multiple phases of two or more sets of multi-phase receivers. For example, in a three-scale track system as shown in FIG. 2, the input multiplexer 155 can choose between 9 possible phase pairs to process. To cancel certain circuit errors, it can also choose these phase pairs in a reverse polarity mode that effectively inverts the signal. Thus there are in total 18 possible ways to process the 9 phase pairs of a three-scale-track, three-phase system.

Figure 3:
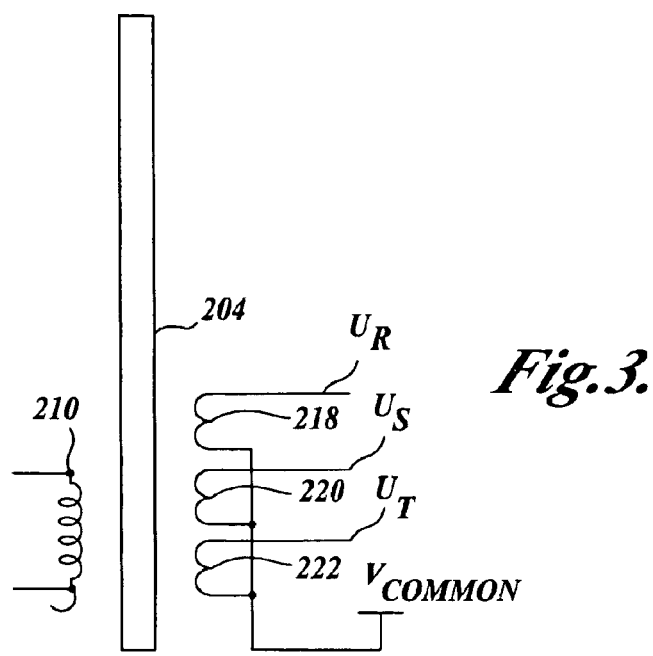
FIG. 3 is a schematic diagram illustrating one embodiment of connections for the three-phase windings illustrated in FIG. 2.

FIG. 3 shows a schematic diagram illustrating one possible set of interconnections for one of the three-phase windings of FIG. 2. As illustrated, the three windings 218, 220 and 222, each have their lower portions connected to a common node. In the diagram of FIG. 3, the common node is shown to be connected to a reference voltage $V_{COMMON}$, which in various exemplary embodiments may be set at a voltage level suitable for biasing the input of one or more amplifiers in an analog signal processor which receives signals from the three-phase windings 218, 220 and 222. As also shown in FIG. 3, a primary winding 210 is located on the other side of a scale 204 from the three-phase windings 218, 220 and 222. In a physical layout, the three-phase windings 218, 220 and 222 are offset from each other along the measurement axis by ⅓ of a wavelength λ.

Figure 4:
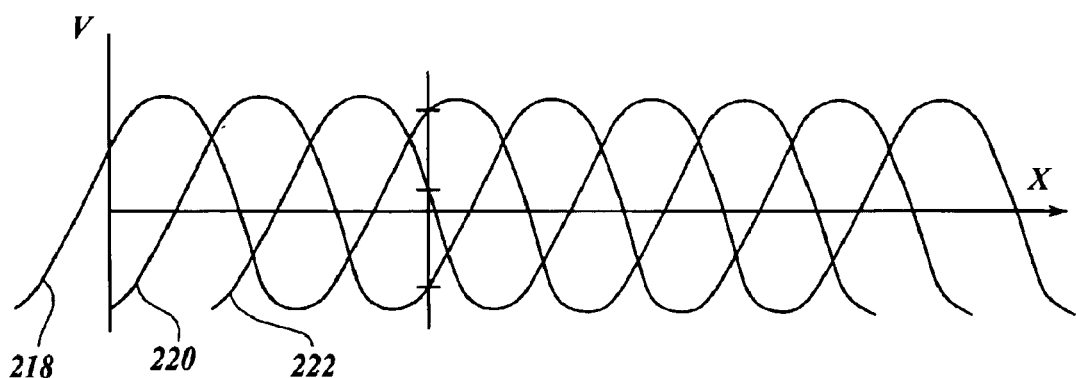
FIG. 4 is an output diagram of the three-phase windings of FIG. 3 showing the signal amplitudes of the three-phases as a function of the relative position of the scale within the transducer.

FIG. 4 shows the amplitudes of the signal from the three receivers, which are sinusoidal as a function of the position along the measurement axis. It will be appreciated that perfectly sinusoidal output functions of FIG. 4 are difficult to achieve in practice, and that deviations from a perfect sinusoidal output contain spatial harmonics of the fundamental wavelength of the transducer. Such spatial harmonics are significant not only in systems such as the measurement system 108, but also in the output signals of nearly all multi-signal displacement transducers such as linear and rotary optical encoders, resolvers, synchro's, INDUCTOSYN® displacement transducers, and the like. Such spatial harmonics are a limiting factor in the accuracy of many such devices, and precise devices often incorporate special design features to reduce or eliminate these harmonics. Therefore, the three-phase configuration of this embodiment of the induced current position transducer has a significant advantage over other embodiments of the transducer in that the third harmonic content in the separate receiver windings' signal can be largely eliminated as a source of position measurement error.

Figure 5:
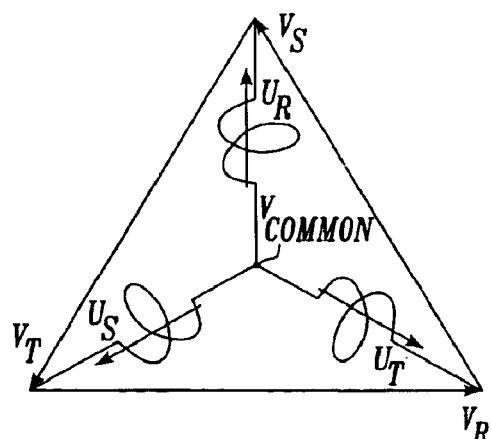
FIG. 5 is a schematic vector phase diagram for the three-phase windings of FIG. 3.

Eliminating the third harmonic may be accomplished, for example, by combining the outputs of the receiver windings as shown in FIG. 5, where the three windings are connected in a star configuration and the signals used for determining position are taken between the corners of the star. The following equations outline how the third harmonic component is eliminated by suitably combining the original three-phase signals, designated as $U_R$, $U_S$, and $U_T$.

Assume each of the unprocessed phase signals contains the fundamental sinusoidal signal plus the third harmonic signal, with equal amplitude in the three-phases, then:

$$U_R = A_0 \sin\left(2\pi \frac{x}{\lambda}\right) + A_3 \sin\left(2\pi \frac{3x}{\lambda}\right)$$

$$U_S = A_0 \sin\left(2\pi \frac{x + \frac{\lambda}{3}}{\lambda}\right) + A_3 \sin\left(2\pi \frac{3\left(x + \frac{\lambda}{3}\right)}{\lambda}\right)$$

$$= A_0 \sin\left(2\pi \frac{x}{\lambda} + \frac{2\pi}{3}\right) + A_3 \sin\left(2\pi \frac{3x}{\lambda} + 2\pi\right)$$

$$= A_0 \sin\left(2\pi \frac{x}{\lambda} + \frac{2\pi}{3}\right) + A_3 \sin\left(2\pi \frac{3x}{\lambda}\right)$$

$$U_T = A_0 \sin\left(2\pi \frac{x - \frac{\lambda}{3}}{\lambda}\right) + A_3 \sin\left(2\pi \frac{3\left(x - \frac{\lambda}{3}\right)}{\lambda}\right)$$

$$= A_0 \sin\left(2\pi \frac{x}{\lambda} - \frac{2\pi}{3}\right) + A_3 \sin\left(2\pi \frac{3x}{\lambda} - 2\pi\right)$$

$$= A_0 \sin\left(2\pi \frac{x}{\lambda} - \frac{2\pi}{3}\right) + A_3 \sin\left(2\pi \frac{3x}{\lambda}\right)$$

When operations are performed to properly pair-wise subtract the above-outlined signals from each other, such operations can eliminate the third harmonic from the resulting signal, as indicated by the following equations:

$V_R = U_T - U_S =$ Eq. 1
$$A_0\left(\sin\left(2\pi \frac{x}{\lambda} - \frac{2\pi}{s}\right) - \sin\left(2\pi \frac{x}{\lambda} + \frac{2\pi}{3}\right)\right) = -A_0 \sqrt{3} \cos 2\pi \frac{x}{\lambda}$$

$V_S = U_R - U_T =$ Eq. 2
$$A_0\left(\sin\left(2\pi \frac{x}{\lambda}\right) - \sin\left(2\pi \frac{x}{\lambda} - \frac{2\pi}{3}\right)\right) = A_0 \sqrt{3} \cos\left(2\pi \frac{x}{\lambda} - \frac{2\pi}{6}\right)$$

$V_T = U_S - U_R =$ Eq. 3
$$A_0\left(\sin\left(2\pi \frac{x}{\lambda} - \frac{2\pi}{3}\right) - \sin\left(2\pi \frac{x}{\lambda}\right)\right) = A_0 \sqrt{3} \cos\left(2\pi \frac{x}{\lambda} + \frac{2\pi}{6}\right)$$

Operations corresponding to the preceding equations can be performed using the present invention, by taking differential signal measurements between appropriate pairs of the signals $U_R$, $U_S$ and $U_T$, to determine the signal values of $V_R$, $V_S$ and $V_T$. Thus, the present invention is particularly useful for suppression of common-mode third harmonic content in the differential input signals, as described in greater detail below.

FIG. 6 shows a block diagram of an exemplary embodiment of an analog-to-digital converter formed in accordance with the present invention. As shown, the signals input to the exemplary analog-to-digital converter 300 are designated as differential inputs Ph0+ and Ph0−, differential inputs Ph1+ and Ph1−, and differential inputs Ph2+ and Ph2−. As illustrated in FIG. 6, the analog-to-digital converter 300 is implemented as a parallel, differential input, single ramp converter with two matched comparators for each leg of differential input. Therefore, the six inputs from the three phases are provided to six comparators 301 to 306. Each of the inputs Ph0+, Ph0−, Ph1+, Ph1−, Ph2+, Ph2− is provided to the positive input of one of the comparators 301, 302, 303, 304, 305, and 306, respectively. The negative inputs of each of the comparators 301 to 306 is provided from the ramp generator 310. The specific operation of the ramp generator 310 relative to the ramp analog-to-digital converter 300 will be described in more detail below with reference to FIGS. 8 and 9.

The outputs of the six comparators 301 to 306 are provided to three logic/counter circuits 330 to 332. More specifically, the outputs of the comparators 301 and 302 are provided to the logic counter 330, while the outputs of the comparators 303 and 304 are provided to the logic counter 331, and the outputs of the comparators 305 and 306 are provided to the logic counter 332. A temporary clock 320 also provides an input to each of the logic counters 330, 331, and 332. One or more of the logic/counter circuits 330–332 together with the temporary clock 320 operates to provide a digital differential value determining circuit. Logic counter 330 provides an output signal $Ph0_{out}$ while logic counter 331 provides an output signal $Ph1_{out}$, and logic counter 332 provides an output signal $Ph2_{out}$. Each of the logic/counter outputs is equal to the positive counter output minus the negative counter output, thus the output $Ph0_{out}$ is equal to [CNT0+]−[CNT0−], while the output $Ph1_{out}$ is equal to [CNT1+]−[CNT1−], and the output $Ph2_{out}$ is equal to [CNT2+]−[CNT2−].

As previously discussed, the systems and methods of this invention are particularly useful for suppression of common-mode third harmonic content in the differential input signals. In one embodiment of a system which illustrates this utility, with reference to FIG. 5, each of the three outputs ($U_S$, $U_T$ and $U_R$) Of the three-phase windings is provided as two of the input signals to the exemplary analog-to-digital converter 300 of FIG. 6. In particular, the output $U_S$ is provided as both the negative differential input Ph0− and the positive differential input Ph1+, while the output $U_T$ is provided as both the negative differential input Ph1− and the positive differential input Ph2+, while the output $U_R$ is provided as both the negative input Ph2− and the positive input Ph0+.

With reference to the previously discussed equations Eq. 1–3, it should be appreciated that when the signal $U_S$ is provided as both the negative differential input Ph0− and the positive differential input Ph1+, and the signal $U_T$ is provided as both the negative differential input Ph1− and the positive differential input Ph2+, and the signal $U_R$ is provided as both the negative differential input Ph2− and the positive differential input Ph0+, then the output $Ph0_{out}$ corresponds to $V_R$, while the output $Ph1_{out}$ is corresponds to $V_S$, and the output $Ph2_{out}$ corresponds to $V_T$. Thus, it should be appreciated that exemplary analog-to-digital converter 300 is generally useful for suppression of common-mode harmonic content in the differential input signals, and particularly useful for the suppression of third-order spatial harmonic content in differential input signals which are output by three-phase displacement transducers such as encoders, resolvers, and the like.

As described above, the signal processing techniques using fully differential circuits are able to cancel the common-mode third harmonic distortion in an attached system which provides the differential inputs. These techniques allow the accuracy of measurements made using circuits according to the systems and methods of this invention to be maximized, even though the circuit is operated according to the limited voltage and power supply requirements of a variety of portable and handheld instruments. As will be described in more detail below, it is a goal of the present invention to implement a low power low voltage system that works with and maintains the advantages of differential measurement, and that can furthermore acquire multiple differential signals in parallel, such as may be needed for the exemplary three-phase transducer configuration described above. The analog-to-digital converter of the present invention is designed toward that end.

In one application, the analog-to-digital converter of the present invention may be used in a handheld displacement measuring device that operates from a single 1.5 volt watch battery or solar cell, and which has total measuring instrument current drain as low as 5 microamps. Thus, the analog-to-digital converter of the present invention is operable from a single 1.5 volt watch battery or solar cell and draws current which is a fraction of 5 microamps . For reasons that will be described in more detail below, in the systems and methods of the present invention minimize the current drain and maximize the dynamic range of the included analog circuits by using fully differential circuits, powering them from a 1.5 volt source, and further may use NMOS switches with voltage boosters.

The ramp analog-to-digital converter of FIG. 6 can be implemented with relatively simple circuitry, and consequently be of a small size. Small size is an advantage regarding the cost and packaging size required for the present invention. An operating speed limitation of the system is due to the nature of the ramp itself, since a ramp inherently takes time to transition. However, since high-speed operation is not a critical factor in the signal processing of a variety of portable or handheld measuring instruments (e.g., electronic calipers), this implementation provides an effective tradeoff of a slower system for one that uses less power, is of a smaller size and is operable from low voltage. For the sampling speed of the many portable measuring systems, a primary consideration is making the samples frequent enough to avoid flickering on the display that can be detected by the human eye. In one embodiment, a sampling rate of about 10 samples per second (thus having a processing time per sample of about 100 ms) is sufficient to address this consideration.

As illustrated in FIG. 6, in one embodiment the present invention is implemented as a parallel, single ramp analog-to-digital converter with two comparators per differential-pair channel (one for each signal of the differential signal pair.) In this implementation, the scale factor matches perfectly for all three phases. Furthermore, in this implementation the analog-to-digital converter can be extended to process two scales simultaneously. As will be discussed in more detail below, to limit the size of the charging capacitor of the charging circuit in the ramp generator, a temporary high-speed clock is used during conversion. A 1 megahertz clock gives an effective 12 bit resolution in a 2.048 millisecond (2048 counts times 2) implementation.

The implementation of FIG. 6 also allows differential signals to be processed in parallel, and even multiple sets of differential signals. This provides distinct advantages over systems which attempt to convert the fully differential output to single-ended signals, since such processing will typically introduce unwanted second harmonic distortion. Second order distortion in this type of system can produce significant measurement errors in a variety of applications. For example, if the signals $V_R$, $V_S$, and $V_T$ of equations Eq. 1–3 contain second harmonic distortion (not shown in equations Eq. 1–3) due to signal processing, then displacement calculations based on $V_R$, $V_S$, and $V_T$ will be in error. Therefore, the introduction of second order distortion is extremely undesirable. The present invention provides a way to process the signals as differential signals rather than single-ended signals, such that the production of undesirable second order distortion is avoided.

FIG. 7A shows a graph of a second order distortion that may occur in a typical ramp signal. As illustrated, for a low voltage chip the ramp signal may have some distortion, as the dynamic range is limited. FIG. 7B is a graph showing the symmetrical third order distortion that may occur in an analog-to-digital converter according to the present invention using such a ramp. Since the analog-to-digital converter of the present invention is fully differential, the second order distortion is effectively transformed into a third order distortion nonlinearity of the form shown.

Circuits according to the systems and methods of this invention are advantageous in many important applications because signal distortion of the second harmonic type is essentially avoided, while the limited third harmonic type signal distortion that is introduced by the circuit is easily eliminated by subsequent signal processing. For example, returning to the previous discussion of a system where each of the three outputs ($U_S$, $U_T$, and $U_R$) of the three-phase windings of FIG. 3 is provided as two of the input signals to the exemplary analog-to-digital converter 300 of FIG. 6 and the output Ph0$_{out}$ corresponds to $V_R$, while the output Ph1$_{out}$ corresponds to $V_R$, and the output Ph2$_{out}$ corresponds to $V_T$, let us now assume that the signals $V_R$, $V_S$, and $V_T$ of equations Eq. 1–3 each contain a previously unconsidered common-mode third harmonic distortion newly introduced by the signal processing circuitry of the exemplary analog to digital converter 300. Such distortion is represented in the following equations, where the term $a_3$ is the amplitude of the third harmonic distortion:

$$V_{R-distort} = V_R + a_3 \cos\left(2\pi \cdot \frac{3x}{\lambda}\right) \quad \text{Eq. 4}$$

$$V_{S-distort} = V_S - a_3 \cos\left(2\pi \cdot 3\left(\frac{x}{\lambda} - \frac{1}{6}\right)\right) = V_S - a_3 \cos\left(2\pi \cdot \frac{3x}{\lambda} - \pi\right) \quad \text{Eq. 5}$$

$$V_{T-distort} = V_T - a_3 \cos\left(2\pi \cdot 3\left(\frac{x}{\lambda} + \frac{1}{6}\right)\right) = V_S - a_3 \cos\left(2\pi \cdot \frac{3x}{\lambda} + \pi\right) \quad \text{Eq. 6}$$

Fortuitously, in applications where a displacement is determined from three-phase signals such as $V_R$, $V_R$, and $V_T$, it is either convenient or necessary perform operations which derive quadrature signals from the three phase signals, that is, signals which bear the relationship of sine and cosine. Such signals may be determined as follows:

$$Q_{SINE} = \frac{1}{\sqrt{3}}(V_{S-distort} - V_{T-distort}) \quad \text{Eq. 7}$$

$$= \frac{1}{\sqrt{3}}\left[V_S - V_T - a_3\left[\cos\left(2\pi \cdot \frac{3x}{\lambda} - \pi\right) - \cos\left(2\pi \cdot \frac{3x}{\lambda} + \pi\right)\right]\right] \quad \text{Eq. 8}$$

$$= \frac{1}{\sqrt{3}}[V_S - V_T] \quad \text{Eq. 9}$$

$$Q_{COSINE} = -\frac{1}{\sqrt{3}}(2V_{R-distort} - V_{S-distort} - V_{T-distort}) \quad \text{Eq. 10}$$

$$= -\frac{1}{\sqrt{3}}\left[2V_R - V_S - V_T + \right. \quad \text{Eq. 11}$$

$$\left. a_3\left[2\cos\left(\frac{6\pi x}{\lambda}\right) + \cos\left(\frac{6\pi x}{\lambda} - \pi\right) + \cos\left(\frac{6\pi x}{\lambda} + \pi\right)\right]\right]$$

$$= -\frac{1}{3}[2V_R - V_S - V_T] \quad \text{Eq. 12}$$

It should be appreciated that the distortion terms associated with third harmonic signal processing distortion have been eliminated by the operations of equations Eq. 7–12 and displacements calculated based on the results of equations Eq. 7–12 will thus be free of common-mode third harmonic errors introduced by signal processing. Thus, it should be further appreciated that the particular combination of signal processing characteristics associated with the present invention are of particular advantage in a number of applications of circuits according to the systems and methods of this invention where signal processing or calculations may be used to remove common-mode third harmonic signal distortion, and more particularly in those applications where displacement determinations are calculated based on three-phase transducer signals.

Figure 8:
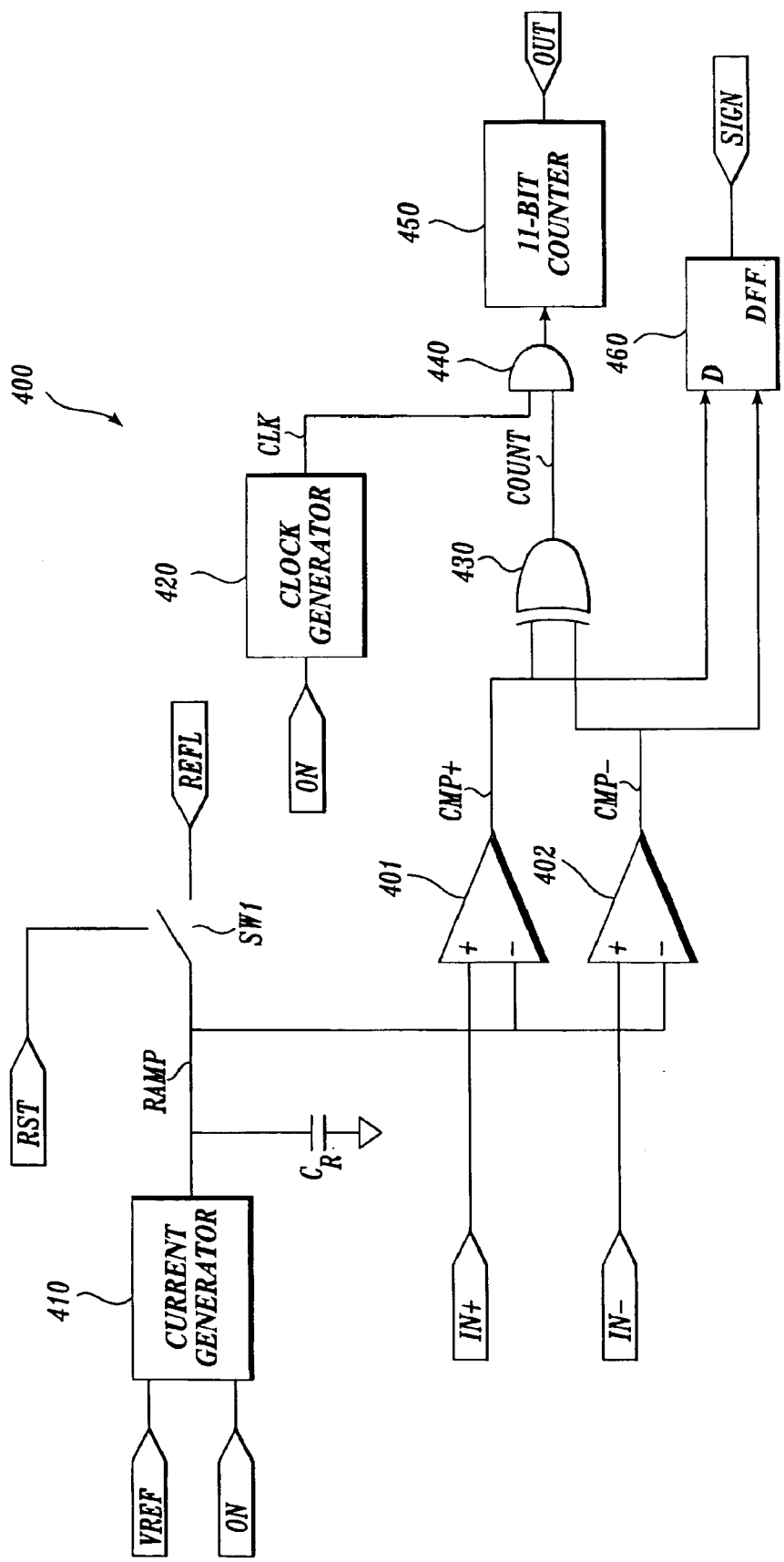
FIG. 8 is a block diagram of one embodiment of a logic circuit for one of the differential channels of the analog-to-digital converter of FIG. 6.

FIG. 8 is a block diagram of a logic circuit 400 illustrating the processing for one of the three phases of the analog-to-digital converter 300 of FIG. 6. The comparators 401 and 402 represent a pair of the comparators 301 to 306, and the input signals IN+ and IN− represent the positive and negative portions of one of the phase signals Ph0, Ph1, or Ph2. The signal RAMP is provided to the negative inputs of each of the comparators 401 and 402. The signal RAMP is provided by a current generator 410, which will be discussed in more detail below with reference to FIG. 10. The inputs to current generator 410 are the reference signal $V_{REF}$ and the signal ON. The reference signal $V_{REF}$ controls the current generator 410 and thus the ramp current and therefore the scale factor. In various exemplary embodiments, $V_{REF}$ is derived directly from the overall system power supply (using a divider), and the overall measurement system's scale factor (peak-to-peak counts for each signal derived from a transducer) is thereby made to be independent of the system supply voltage variations, as will be described in more detail below. In one 1.5V system embodiment, the reference signal $V_{REF}$ is at 0.75V, or one half of the power supply voltage.

A capacitor $C_R$ is coupled between the output of the current generator 410 and ground. A switch SW1 is controlled by control signal RST to couple the signal RAMP to a signal REFL. The signal RAMP is reset to the signal REFL, which is selected to be the lowest end of the input signal range, rather than ground in order to save time (and current). In one 1.5V system embodiment, with a signal range of 750 mV maximum (600 mV nominal), the signal REFL is set at approximately 375 mV.

The output signal CMP+ of comparator 401 is provided as both an input to an exclusive OR 430 gate and as an input to a DFF block 460. Similarly, the output signal CMP− of the comparator 402 is provided as an input to the exclusive OR gate 430 as well as an input to the DFF block 460. The output signal COUNT of the exclusive OR gate 430 is provided as an input to an AND gate 440. A second input of the AND gate 440 is a signal CLK received from a clock generator 420. Clock generator 420 receives the input signal ON. The clock generator 420 will be discussed in more detail below with reference to FIG. 11. The output of the AND gate 440 is provided to an 11 bit counter 450. The output of the counter 450 is the signal OUT. The output of the DFF block 460 is the signal SIGN. The signal SIGN adds an additional bit to the 11 bit output of the counter 450, thus creating an overall output of 12 bits of the logic circuit 400.

It will be appreciated that the logic current 400 of FIG. 8 is merely shown as an exemplary embodiment. One particular design choice is either to use one counter for each phase, or one counter with two sets of registers for each phase. The optimum approach will depend on the size and current consumption requirements. In general, the current drain is often dominated by the oscillator and the counter(s).

In the particular embodiment of the logic circuit 400 of FIG. 8, the counter 450 may be a ripple counter, which typically has a low current drain, since it minimizes the number of toggles. To minimize the number of registers, the count value is stored in the counter itself. It should also be noted that no subtraction circuit is needed. The sign signal SIGN is stored in a separate register. The end result of these design choices is a highly efficient circuit, both in terms of small size and low current drain. However, it will be appreciated that this is merely an exemplary embodiment and that other design choices may obviously be made.

Also in the embodiment of the logic circuit 400 of FIG. 8, the comparators may be implemented in any way suitable for low voltage low power operation. Either a low power operational amplifier-type comparator or a dynamic comparator may be used. The reader is referred to the chapter titled "Comparators" in *Analog Integrated Circuit Design* by David Johns and Ken Martin, published by John Wiley and Sons, Inc., 1997. Comparators having a switched capacitor input have the advantage of storing the input voltage on the input capacitor, which allows the preceding stage of the analog signal processing circuitry to be turned off, thereby saving power and facilitating cancellation of the comparator offset. In an embodiment using comparators having an internal switched capacitor input, the capacitor is preferably internally switchably connected to the input signal input during a reset phase, and just prior to conversion of an input signal, the input signal input is switchably disconnected and the ramp signal is switchably connected to the capacitor input at the start of the input signal conversion. In general, since the comparators are identical, any delays and parasitic effects should not affect accuracy and the choice of the low voltage low power comparator design is not critical.

Figure 9A:
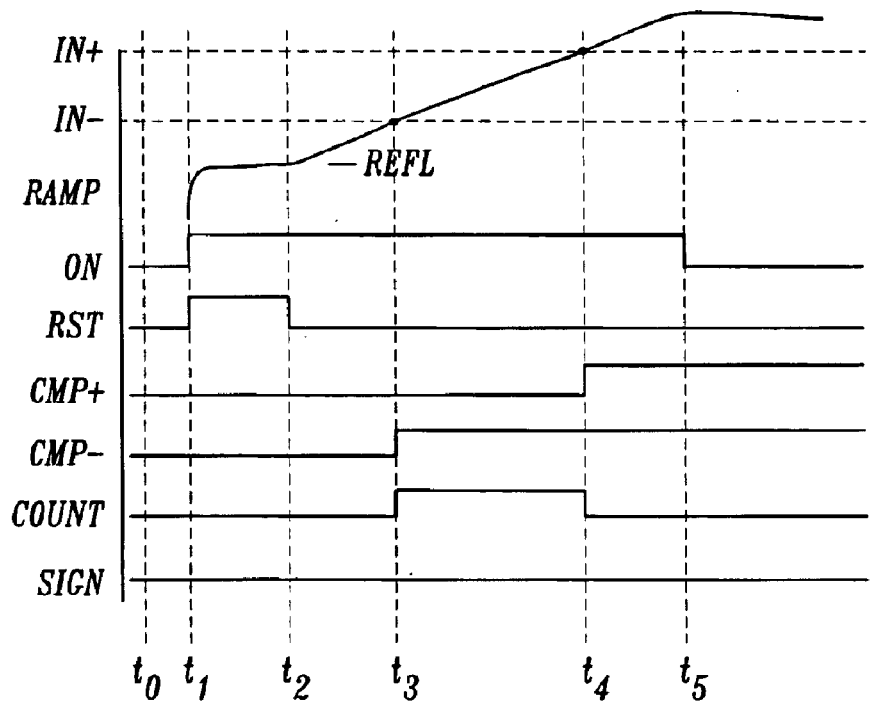
FIG. 9A is a timing diagram illustrating the operation of the logic circuit of FIG. 8 for a positive counter output value.
Figure 9B:
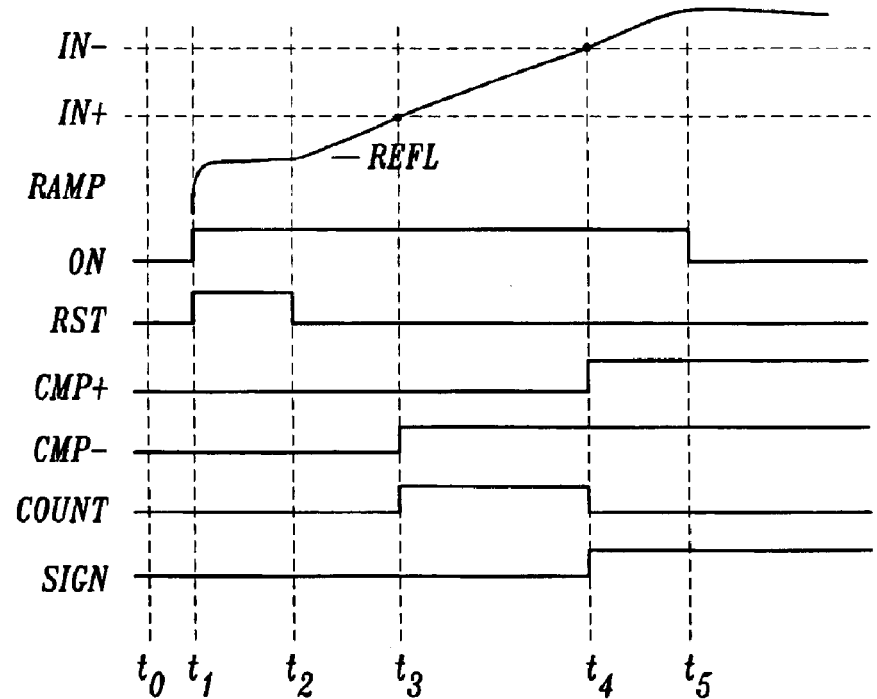
FIG. 9B is a timing diagram illustrating the operation of the logic circuit of FIG. 8 for a negative counter output value.

FIGS. 9A and 9B are timing diagrams illustrating the operation of the logic circuit 400 of FIG. 8. FIG. 9A illustrates an example of a positive counter output value, while FIG. 9B illustrates an example of a negative counter output value.

As illustrated in FIG. 9A, at a time T0 all of the signals are low. At a time T1, the signal ON transitions high, as does the signal RST. With reference to FIG. 8, the signal ON activates the current generator 410 and clock generator 420. The signal RST closes the switch SW1 so as to tie the output of the current generator 410 and consequently the signal RAMP to the signal level REFL. Thus, the signal RAMP rises to the signal level REFL.

At a time T2, the signal RST transitions low. With reference to FIG. 8, this opens the switch SW1 and allows the signal RAMP to increase at a linear rate as driven by the current generator 410. At a time T3, the signal RAMP passes the level of the input signal IN− of the comparator 402, and the output signal CMP− of the comparator 402 transitions high. This transition also causes the output COUNT of the exclusive OR gate 430 to transition high. This sequence, in combination with the clock generator output signal CLK, causes the counter 450 to start to count.

At a time T4, the signal RAMP passes the level of the input signal IN+ of the comparator 401. This causes the output of the comparator 401 to transition high, thus causing the output COUNT of the exclusive OR gate 430 to transition low, which through the AND gate 440 causes the counter 450 to stop counting. At a time T5, the signal ON transitions low and the signal RAMP stops increasing.

As described above, the sequence shown in FIG. 9A causes the counter 450 to produce a digital value that is representative of the difference between the analog levels of the signals IN+ and IN−. The fact that the signal SIGN from the output of the DFF block 460 remains low, indicates that the digital output represents a positive counter output value. This method provides a way to achieve a digital output of the difference between two differential analog signals.

FIG. 9B is similar to FIG. 9A except that it illustrates the function of the circuit for a negative counter output value. All of the signal levels are the same as in FIG. 9A, except that the levels of the signals IN+ and IN− have been swapped. Thus, at time T3, the signal RAMP passes the level of the signal IN+, thus causing the output CMP+ of the comparator 401 to transition high and start the counter 450. At time T4, the signal RAMP passes the level of the signal IN+, thus causing the output of CMP+ of the comparator 401 to transition high. This causes the output COUNT of the exclusive OR gate 430 to transition low, and stops the counter 450. One important difference between FIGS. 9A and 9B is that at time T4, in FIG. 9B, the output SIGN of the DFF block 460 transitions high. The signal SIGN being high provides an indication to the logic circuitry that the digital value from the counter 450 represents a negative counter output value.

Figure 10:
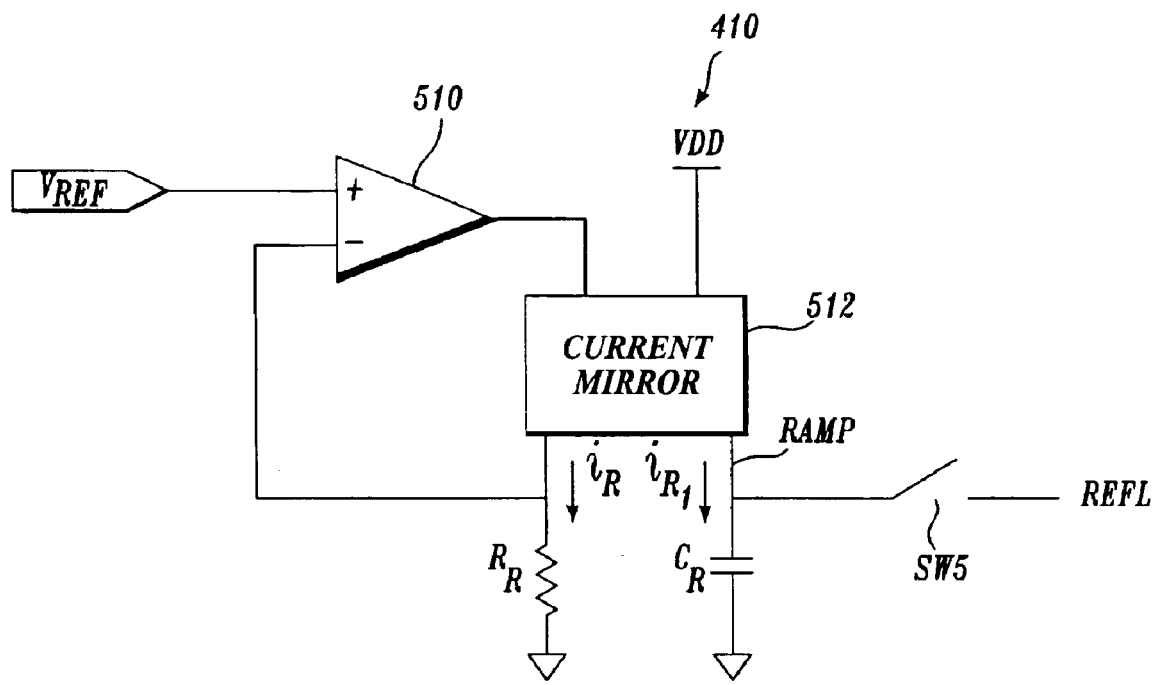
FIG. 10 is a block diagram of the current generator of FIG. 8.
Figure 11:
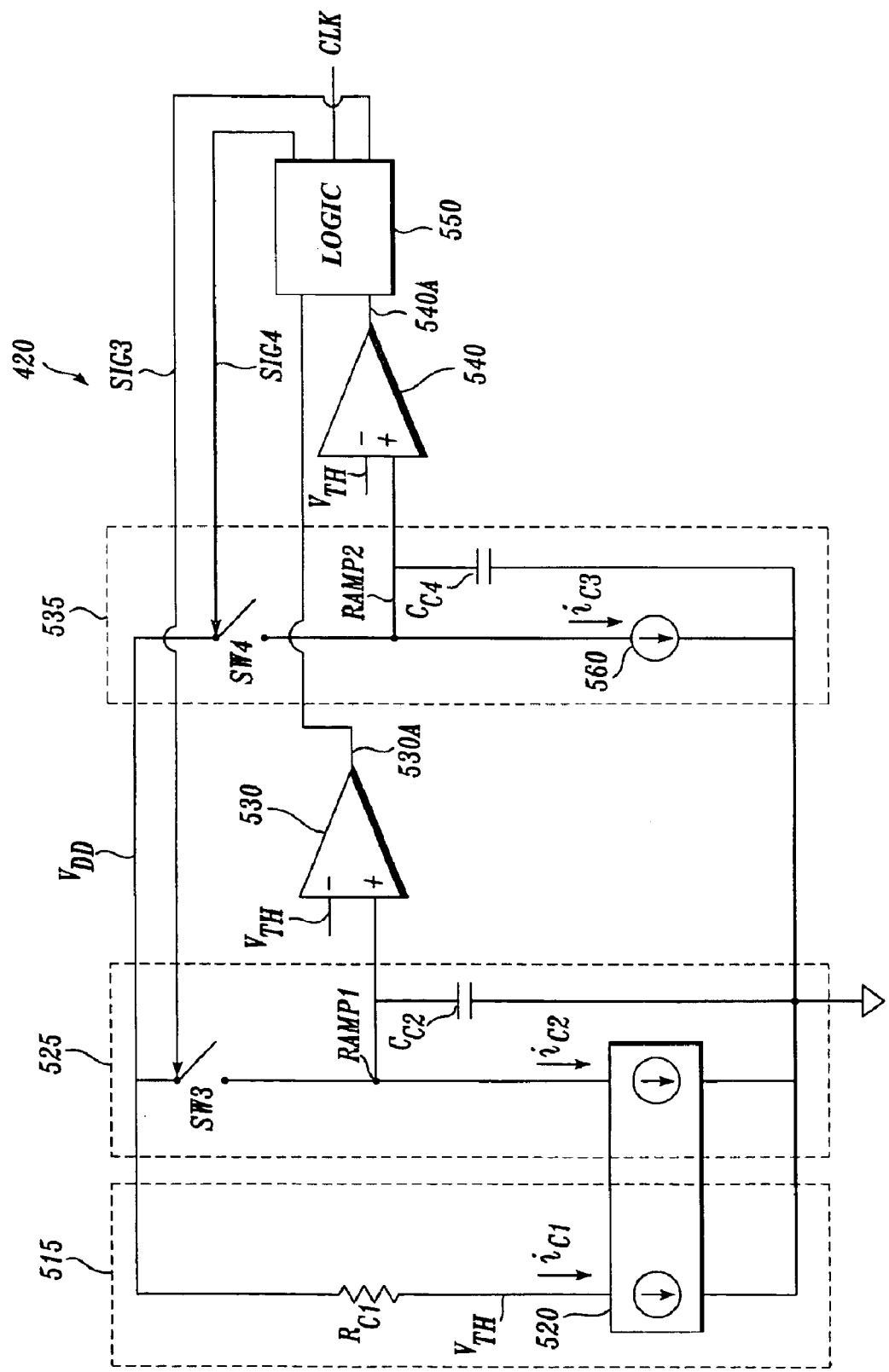
FIG. 11 is a block diagram of the clock generator of FIG. 8.

FIGS. 10 and 11 are block diagrams of the current generator 410 and clock generator 420, respectively, of FIG. 8. With regard to the design of these circuits, certain components are selected to reduce the sensitivity of the overall system to process parameters. More specifically, by using capacitors of the same type in the ramp generator and clock generator, and charging them with scaled bias currents, the scale factor of the system is made to be independent of process parameters.

FIG. 10 shows a block diagram of the current generator 410 of FIG. 8 for generating the ADC ramp signal. An operational amplifier 510 receives the reference signal $V_{REF}$ at its positive input. The output of the amplifier 510 is provided to a current mirror 512. Current mirror 512 also receives power supply voltage VDD. The current mirror 512 is coupled through a resistor $R_R$ to ground, and the node between the resistor $R_R$ and the current mirror 512 is also coupled to the negative input of the amplifier 510. The output OUT of the current mirror 512 provides a current level equal to $I_{R1}$ which mirrors the current $I_R$ which passes through the resistor $R_R$. The output OUT from the current mirror 512 is coupled to the capacitor. The output OUT is also coupled through a switch SW5 to the reference signal REFL. The output signal OUT provides the ramp signal RAMP.

FIG. 11 is a block diagram of one exemplary embodiment of the clock generator 420 of FIG. 8. As shown, a current mirror 520 is coupled in its first branch through a resistor $R_{C1}$ to the power supply voltage VDD and a current $i_{C1}$ is established in the current mirror. The node between the resistor $R_{C1}$ and the first branch of the current mirror 520 determines the signal $V_{TH}$=VDD−($R_{C1}$*$i_{C1}$). The resistor $R_{C1}$ and the first branch of the current mirror 520 form a current setting circuit 515. The second branch of the current mirror 520 is coupled to the positive input of a comparator 530. A signal RAMP1 is designated as the signal at the positive input of the comparator 530. The positive input of the comparator 530 is also coupled through a switch SW3 to the power supply voltage VDD. Switch SW3 is controlled by a signal SIG3 from a logic circuit 550. The positive input of the comparator 530 is also coupled through a capacitor $C_{C2}$ to ground. The components switch SW3, capacitor $C_{C2}$, and second branch of the current mirror 520 all form a ramp circuit 525. The negative input of the comparator 530 receives a voltage signal $V_{TH}$. The output of the comparator 530 is provided to the logic circuit 550.

The output of a comparator 540 is also provided to the logic circuit 550. Similar to the comparator 530, the comparator 540 receives the voltage signal $V_{TH}$ at its negative input. The positive input of the comparator 540 is coupled through a capacitor $C_{C4}$ to ground. A current source 560 is also coupled to the positive input of the comparator 540. A switch SW4 also couples the positive input of the comparator 540 to the power supply voltage VDD. Switch SW4 is controlled by a control signal SIG4 from the logic circuit 550. The signal on the positive input of the comparator 540 is designated as signal RAMP2. The output of the logic circuit 550 is the clock signal CLK. The components switch SW4, capacitor $C_{C4}$, and current source 560 form a ramp circuit 535.

Figure 12:
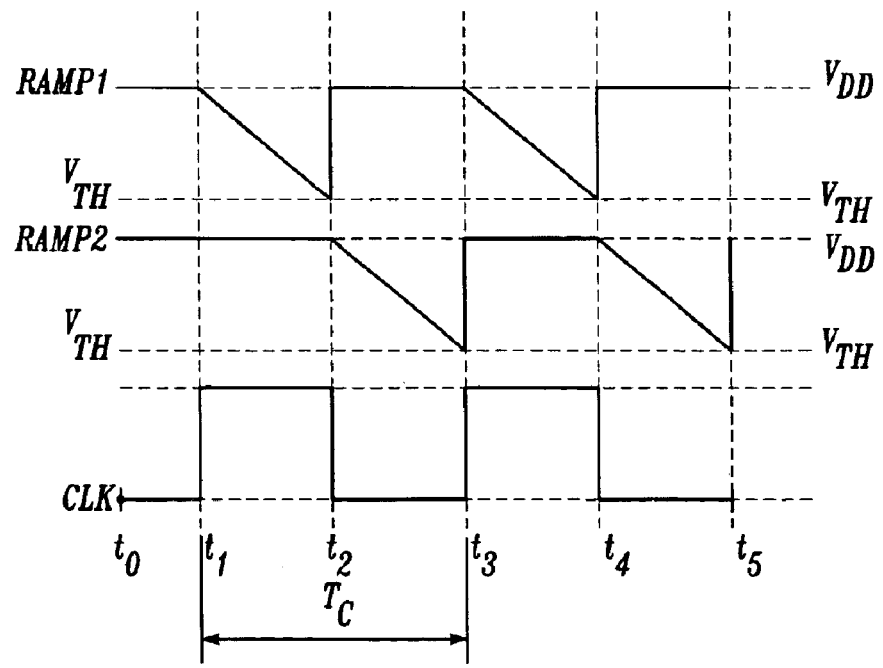
FIG. 12 is a timing diagram illustrating the operation of the clock generator of FIG. 11.

FIG. 12 shows timing diagrams illustrating the operation of the clock generator 420 of FIG. 11. As illustrated, at a time T0 both the signals RAMP1 and RAMP2 are high, and the clock signal CLK is low. At a time T1, the clock signal CLK transitions high, which causes the ramp signal RAMP1 to begin transitioning downward from the power supply voltage VDD at a linear slope. At a time T2, the ramp signal RAMP1 reaches the signal level $V_{TH}$, which causes the output 530A of the comparator 530 to transition. The transitioning of the output 530A causes the logic circuit 550 to transition. The logic circuit 550 thus transitions the clock signal CLK low at time T2. This also causes the logic circuit 550 to transition the signal SIG3 so as to close the switch SW3 and tie the signal RAMP1 to the power supply voltage VDD. The signal SIG4 is also transitioned so as to open a switch SW4, thus allowing the signal RAMP2 to begin transitioning downward from the power supply voltage VDD at a linear slope.

At a time T3, the signal RAMP2 reaches the voltage level $V_{TH}$, thus causing the comparator 540 to transition. The transitioning of the output 540A of the comparator 540 causes the logic circuit 550 to transition its output signals. Therefore, the logic circuit 550 transitions the control signal SIG3 low, the control signal SIG4 high, and the clock signal CLK high. The transitioning of the control signal SIG3 low opens the switch SW3, thus allowing the signal RAMP1 at the input of the comparator 530 to begin transitioning downward at a linear slope. The transitioning of the signal SIG4 high closes the switch SW4, thus tying the signal RAMP2 at the positive input of the comparator 540 to the power supply voltage VDD.

At time T4, the process repeats similar to what occurred at time T2. Thus, the signal RAMP1 transitions to the power supply voltage VDD as switch SW3 is closed, and the signal RAMP2 begins transitioning downward at a linear slope as the switch SW4 is opened. The clock signal CLK also transitions low.

Figure 13:
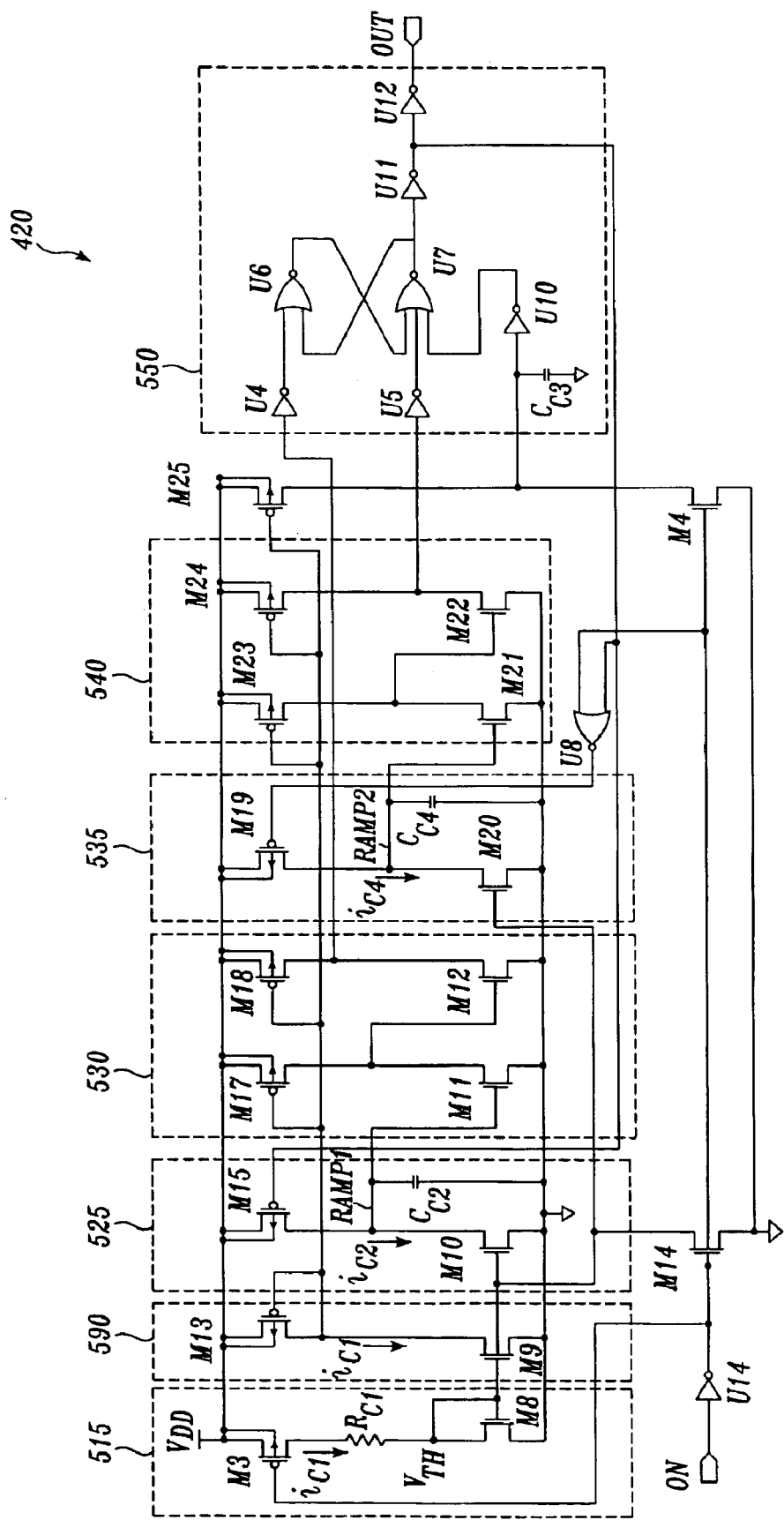
FIG. 13 is a detailed schematic diagram of the clock generator of FIG. 11.

FIG. 13 is a detailed schematic diagram of one exemplary embodiment of circuit which provides the functions of the clock generator 420 of FIG. 11. As illustrated in FIG. 13, various portions of the circuit correspond to various components from the clock generator of FIG. 11 with regard to function. However, in FIG. 13, two PMOS transistors M17 and M18, as well as two NMOS transistors M11 and M12 operate in an unconventional configuration to provide the function provided by the conventional comparator 530 of FIG. 11, as described in detail below. Likewise, two PMOS transistors M23 and M24, as well as two NMOS transistors M21 and M22 operate in an unconventional configuration to provide the function provided by the conventional comparator 540 of FIG. 11, as described in detail below.

The ramp circuits 525 and 535 are also shown in FIG. 13. As illustrated in FIG. 13, the ramp circuit 525 includes a PMOS transistor M15, an NMOS transistor M10, as well as the capacitor $C_{C2}$. The ramp circuit 535 includes a PMOS transistor M19, an NMOS transistor M20, as well as the capacitor $C_{C4}$.

The logic circuit 550 is also shown in FIG. 13. As illustrated, the logic circuit 550 includes five inverters U4, U5, U10, U11, and U12, as well as two OR gates U6 and U7, and a capacitor $C_{C3}$. Also illustrated in FIG. 13 is an exemplary embodiment of a current setting circuit 515 that is integrally coupled to a comparator governing circuit 590 that is usable according to the systems and methods of this invention. The comparator governing circuit 590 (not shown in FIG. 11) includes a PMOS transistor M13, as well as an NMOS transistor M9. As illustrated, the current setting circuit 515 is coupled to the comparator governing circuit 590 in a current mirror configuration. As shown, the resistor $R_{C1}$ is connected to the power supply voltage VDD through PMOS transistor switch M3 and to the gate of NMOS transistor M8. Based on the operating characteristics of transistor M8, this configuration determines the threshold voltage $V_{TH}$ at the circuit node connected to the gate of M8 as well as a current $i_{C1}$ in the current setting circuit 515 which satisfies the condition $V_{TH}$=VDD−($R_{C1}$*$i_{C1}$). As shown in FIG. 13, the current $i_{C1}$ is mirrored by the NMOS transistor M9. Thus the current flowing through PMOS transistor M13 of the comparator governing circuit 590, and which is connected to transistor M9, is also set at the level of the current $i_{C1}$. This current level programs the transistor M13 such that the gate voltage of the transistor M13 is set at a level corresponding to the current level of $i_{C1}$ and the operating characteristics of the transistor type used for M13. As shown in FIG. 13, the PMOS transistors M17 and M23, which are sized at two times the size of transistor M13, are connected to transistor M13 in a current mirror configuration and are thus programmed for a current level of 2*$i_{C1}$. Furthermore, the NMOS transistor M11 which is connected to M17 is sized at two times the size of transistor M9, and is programmed by the current level of 2*$i_{C1}$ established by M17. Based on the current density through transistor M11, transistor M11 is thus controlled to exhibit a gate threshold voltage of $V_{TH}$. Transistor M11 thus effectively functions as the signal input of a comparator which switches at a threshold voltage $V_{TH}$. It should be appreciated that the transistors M23, M24, M21, and M22 of comparator 540 function identically to the corresponding transistors M17, M18, M11, and M12 of comparator 530.

As further shown in FIG. 13, the PMOS transistors M10 and M20 which are sized at two times the size of transistor M8, are also connected to transistor M8 in a current mirror configuration and are thus programmed for a current level of 2*$i_{C1}$. The PMOS transistors M10 and M20, serve to determine the discharge currents $i_{C2\ and\ iC4}$ of capacitor $C_{C2}$ and capacitor $C_{C4}$, respectively. Thus, in this exemplary embodiment of the clock circuit 420 of FIG. 13, the discharge currents $i_{C2}$ and $i_{C4}$ respectively, are each controlled to be two times the current $i_{C1}$ in the current setting circuit 515.

It should be appreciated that according to the foregoing discussion, the threshold voltage $V_{TH}$ of each comparator is ultimately controlled based on a common signal which is determined by particular characteristics of the current setting circuit 515. This is a significant aspect of circuit operation in various embodiments according to the systems and methods of this invention, as described in greater detail below. Furthermore, given particular transistor sizes for the transistors M10 and M20, it should be appreciated that discharge currents $i_{C2}$ and $i_{C4}$ are also controlled based the common signal which determines $V_{TH}$, as determined by particular characteristics of the current setting circuit 515. This also is a significant aspect of circuit operation in various embodiments according to the systems and methods of this invention, as described in greater detail below.

Various other components are also shown in FIG. 13, including a PMOS transistor M25, NMOS transistors M4 and M14, an inverter U14, and an OR gate U8. Transistors M25 and M4 in conjunction with inverter U10 and capacitor $C_{C3}$ provide a delay for proper initialization of the clock when it is turned on.

The clock generator 420 shown in FIG. 11 and the embodiment of the clock generator 420 shown in FIG. 13 are each a dual ramp current-driven oscillator. With respect to FIG. 13, since the capacitors $C_{C2}$ and $C_{C4}$ are discharged at a rate of 2$i_{C1}$, governed by the current density mirroring of transistors M10 and M20 respectively, the discharge rate is:

$$\frac{dv}{dt} = \frac{2 \cdot i_{CI}}{C_C} = \frac{2 \cdot (VDD - V_{TH})}{R_{RI} \cdot C_C}$$

where $C_C = C_{C2}$ or $C_{C4}$, as appropriate.

Since the discharge will occur over the range from VDD to $V_{TH}$, the clock period will be given by:

$$T_{clk} = 2 \cdot \frac{VDD - V_{TH}}{\frac{dv}{dt}} = (R_{RI} C_C)$$

For example, with $R_{R1}$=2MΩ and $C_C$=0.5 PF, $T_{clk}$=1 uSec.

Thus, it should be appreciated that the detailed circuit of FIG. 13 is a particularly simple and elegant way of implementing the circuit concepts described with respect to FIGS. 11–12, such that the clock frequency is substantially independent of variations in the supply voltage and transistor process parameters. In particular, through the mirroring techniques described above, the trip-point voltage for the comparators 530 and 540, and the discharge current which governs the clock ramp signals in the comparators 530 and 540, are each controlled based on a common signal such that all voltage supply and transistor parameters variations become common mode factors which do not substantially affect the clock period during normal operation. Thus, the clock period depends only on the relevant resistor and capacitors as described above.

In addition to the calculations for the clock generator components, it is also useful to examine the equations for the overall scale factor of an ADC according to the systems and methods of this invention. First of all, with regard to the exemplary current generator 410 of FIG. 10, the charging rate of the single ramp signal of an analog-to-digital converter, in various exemplary embodiments according to the systems and methods of this invention, is set by the bias circuit resistor $R_R$, the voltage level $V_{REF}$, and the ramp capacitor $C_R$.

The equation for calculating the related single ramp charging rate is shown below:

$$\left(\frac{dv}{dt}\right)_{ADC} = \frac{i_{RI}}{C_R} = \frac{V_{REF}}{(R_R C_R)}$$

If the exemplary clock circuit 420 of FIG. 13 is then used in conjunction with the exemplary single ramp current generator 410, the overall ADC scale factor will be:

$$SF_{ADC}\left[\frac{\text{counts}}{\text{Volt}}\right] = \frac{1}{T_{clk} \cdot \left(\frac{dv}{dt}\right)_{ADC}} = \frac{1}{V_{REF}} \cdot \frac{(R_R C_R)}{(R_{CI} C_C)}$$

The relationship for the clock period, the single ramp charging rate, and the overall ADC scale factor, as shown by the above equations, has two important benefits. First, if the clock resistors and capacitors and the ADC ramp signal generator resistors and capacitors are constructed in a similar manner within a single integrated circuit, the device characteristics will generally match proportionally and the scale factor will be independent of process variations during fabrication. Furthermore, it should be appreciated the scale factor will be significantly independent of environmental variations when the circuit is operating, because the device operating characteristics that determined the scale factor are generally also matched proportionally according to the device design and fabrication, as described above.

Second, since the transducer signal will be proportional to the supply voltage, by deriving $V_{REF}$ directly from the overall system power supply (using a divider), the system's scale factor (peak-to-peak counts for each differential signal from the transducer) will be made to be independent of the system supply voltage variations. Thus, all voltage supply variations, transistor parameters variations, and passive component parameter variations become common mode factors which do not substantially affect the overall measurement accuracy of circuits constructed according to the systems and methods of the invention, as described above.

Another consideration for the overall system of the present invention is the signal droop in the analog-to-digital converter. Since the input signal is stored in the input capacitor of the comparator during conversion, the leakage currents in the comparator switches will cause signal droop in the analog-to-digital converter. Leakage currents in the bias circuit can alter the charging rate and the scale factor of the analog-to-digital converter. As is known in the art, there are at least two causes of leakage currents in an MOS transistor. The first cause may be referred to as drain/source P-N junction reverse currents. The second cause may be referred to as sub-threshold conduction, whereby if $V_{GS}$ is close to zero or slightly below zero, the sub-threshold drain current can be as much as the D/S junction leakage (or more). Using non-minimum length MOS switches reduces sub-threshold conduction.

The analog-to-digital converter of the present invention has a number of advantages with regard to the effects of leakage currents. One advantage is that the effect of leakage in the analog-to-digital converter comparators will be canceled, since the design is fully differential in nature. In addition, while voltage dependent leakage in general will introduce second order distortion, the fully differential nature of the present invention effectively transforms such second order distortion into third order distortion and will thus not introduce position errors when the analog-to-digital converter is used in conjunction with a three-phase transducer system such as that described above.

With regard to specific circuit characteristics achievable according to the present invention, in one exemplary embodiment of a six-channel ADC (six fully differential pairs) according to the systems and methods of this invention, suitable for use in conjunction with 1.5V power supply and a three-phase transducer such as that described above, the average current consumption was approximately 0.8 microamperes and the exemplary ADC could be implemented in an area of approximately 0.8 square millimeters according to a conventional silicon IC layout.

Figure 14:
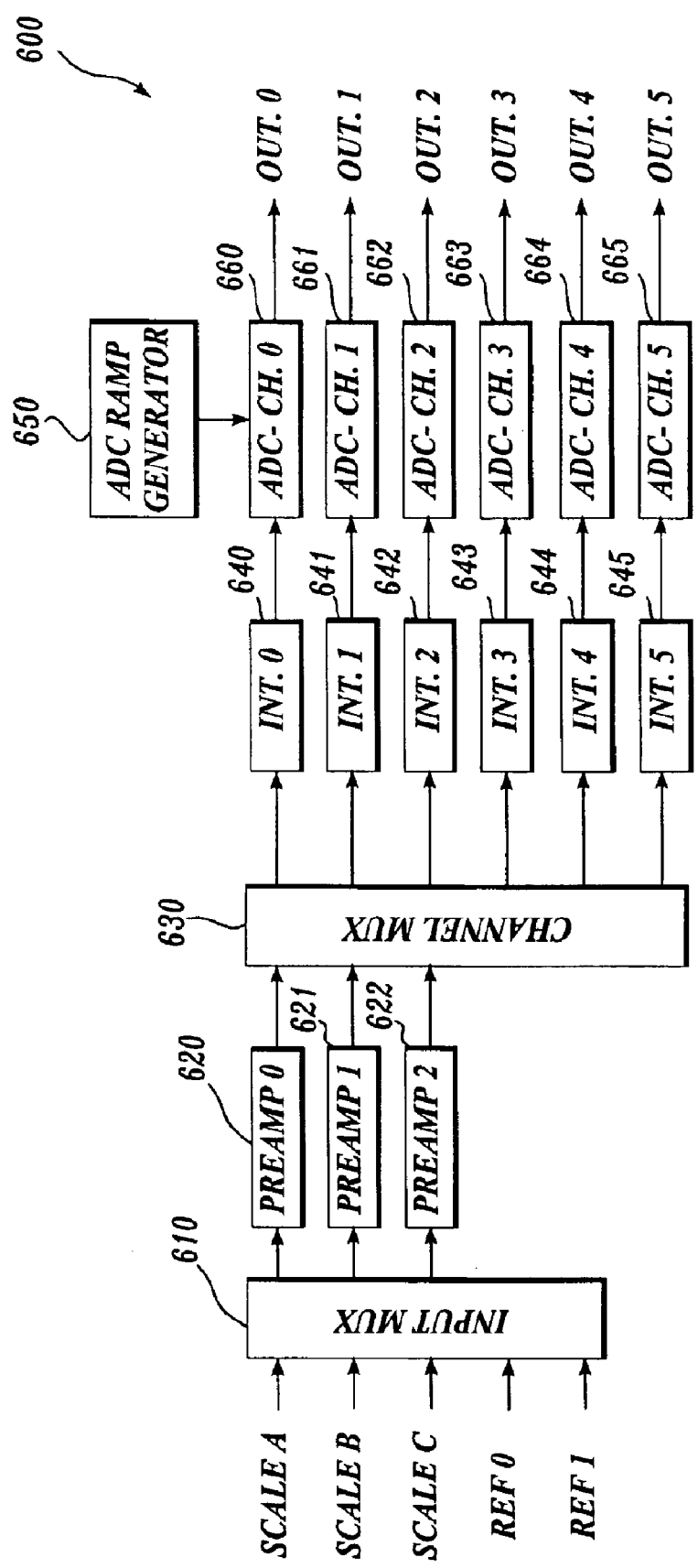
FIG. 14 is a system block diagram for the analog-to-digital converter of FIG. 6 for a analog-to-digital converter having six fully-differential channels.

FIG. 14 illustrates one embodiment of an overall measuring system 600 in accordance with the present invention. Continuing to use the exemplary input provided by a three-phase position transducer, as illustrated, an input multiplexer 610 receives inputs from scales A, B, and C, as well as reference signals REF0 and REF1. The three outputs of the multiplexer 610 are provided to three pre-amplifiers 620–622. The three outputs of the three amplifiers 620–622 are provided to a channel multiplexer 630. The channel multiplexer 630 provides six outputs to six integrator stages 640–645. The outputs of each of the integrator stages 640–645 are each provided to a channel 660–665 of a 6-channel analog-to digital converter. The 6-channel analog-to-digital converter receives a ramp signal from a ramp generator 650. The outputs of the six channels are output signals OUT0–OUT5, which are three phase-related measurements for each of two scales.

The embodiment of the measurement system 600 of FIG. 14 is very power efficient. The pre-amps 620–622 are BiCMOS pre-amplifiers. The system is designed to perform mismatch error correction, in that the input multiplexer 610 receives inputs for two on-chip references, including the zero signal REF0 for offset correction, and a full scale reference signal REF1 for gain mismatch correction. In one embodiment, one cycle per second is used for error correction (alternating between the signals REF0 and REF1).

Figure 15:
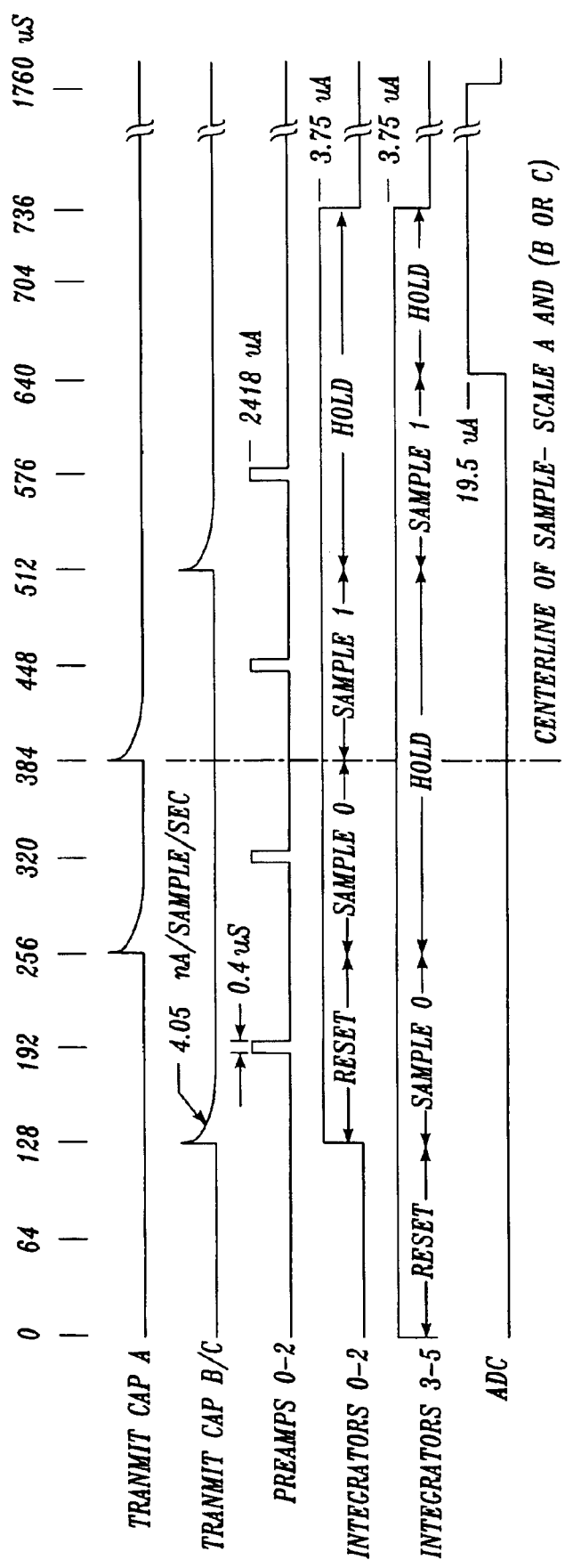
FIG. 15 is a timing diagram illustrating the operation of the block diagram of FIG. 14.

FIG. 15 is a timing diagram illustrating the operation of the measuring system 600 of FIG. 14. As illustrated in FIG. 15, the scale A and B samples are centered on the same point in time (384 uS). This ensures minimum speed-induced errors for position computations using the input provided by the exemplary three-phase position transducer. For each display update, one set of two scales are sampled: A and B, or A and C, for reason as described in the references incorporated herein.

It should be appreciated that all or part of the circuits described with regard to FIGS. 6–15 are suitable for combined fabrication in a single integrated circuit, which may furthermore include at least some of the circuits described with regard to FIG. 2. Furthermore, while the circuits described with regard to FIGS. 6–15 are particularly advantageous for low power low voltage operation, it should be appreciated that circuits according to the systems and methods of this invention retain advantages when fabricated to operate at higher voltage levels. Furthermore, circuits implementations according to the systems and methods of this invention which are operable from a low voltage power supply at lower voltage levels, such as 1.35 volts, 1.5 volts, 3 volts, or 3.5 volts, for example, are also typically able to operate at voltage levels at least three to fives times higher, limited only by the voltage limitations of the processes used to fabricate the circuits. Furthermore, a number of the concepts and circuit portion described herein are advantageously usable both separately and in various combinations, thus, while the preferred embodiment and a limited number of other exemplary embodiments and variations of the invention have been illustrated and described, it will be appreciated that various changes can be made therein without departing from the spirit and scope of the invention.

The embodiments of the invention in which an exclusive property or privilege is claimed are defined as follows:

1. A signal processing system suitable for processing transducer signals in a low power measuring instrument, the signal processing system comprising;
   a reference signal generator for generating an ADC ramp signal;
   one or more differential signal channels, each differential signal channel comprising:
      a first comparator comprising a first input, a second input, and an output, the first input of the first comparator receiving the first signal of a pair of differential signals, the second input of the first comparator receiving the ramp signal, the output of the first comparator providing a first-comparator output signal based on the signals at the first and second inputs; and
      a second comparator comprising a first input, a second input, and an output, the first input of the second comparator receiving the second signal of the pair of differential signals, the second input of the second comparator receiving the ramp signal, the output of the second comparator providing a second-comparator output signal based on the signals at the first and second inputs; and
      one or more digital differential value determining circuits for receiving the first-comparator output signal and the second-comparator output signal of at least one differential signal channel and determining a digital value representative of the difference between the pair of differential signals received by the at least one differential signal channel; and
   wherein the one or more digital differential value determining circuits comprise at least one clock circuit configured such that for at least one comparator included in the clock circuit a trip-point voltage of the comparator and a voltage change rate of a clock ramp signal input to the comparator are both controlled based on a common signal, such that variations in a voltage supplied to the clock during normal operation does not substantially affect the clock period.

2. The signal processing system of claim 1, wherein the signal processing system is operable from a low voltage power supply providing a voltage equal to or less than 1.5 volts.

3. The signal processing system of claim 2, wherein the low voltage power supply comprises at least one of a solar cell, a 1.5 volt coin type battery, and a 1.5 volt button type battery.

4. The signal processing system of claim 1, wherein the at least one clock circuit is fabricated entirely on a single silicon substrate in an integrated circuit.

5. The signal processing system of claim 1, wherein:
   the clock circuit further comprises at least one resistor having a resistance that is a primary determinant of the common signal, and at least one capacitor having a capacitance that is a primary determinant the voltage change rate of the clock ramp signal;

the reference signal generator comprises at least one resistor having a resistance that is a first primary determinant of the generated ADC ramp signal, and at least one capacitor having a capacitance that is a second primary determinant of the generated ADC ramp signal; and wherein a scale factor of the signal processing circuit is affected mainly by the resistance that is a primary determinant of the common signal, the capacitance that is a primary determinant of the voltage change rate of the clock ramp signal, the resistance that is a first primary determinant of the generated ADC ramp signal, the capacitance that is a second primary determinant of the generated ADC ramp signal, and the value of a voltage supplied to the reference signal generator during normal operation.

6. The signal processing system of claim 5, further comprising a power supply usable to provide a first voltage level to the reference signal generator during normal operation and further usable to provide a second voltage level proportional to the first voltage level to a transducer which determines at least one pair of differential signals received by the signal processing system during normal operation;

wherein the scale factor of the signal processing circuit and the signal amplitude of the differential signals determined by the transducer change in a manner that compensates each other with regard to variations in the voltage of the power supply, such that the overall measurement accuracy of a measuring instrument including the signal processing system and the transducer is substantially insensitive to variations in the voltage of the power supply during normal operation.

7. The signal processing system of claim 6, wherein the scale factor of the signal processing circuit is inversely proportional to the first voltage level and the signal amplitude of the differential signals determined by the transducer are proportional to the second voltage level.

8. The signal processing system of claim 1, wherein:

the at least one digital differential value determining circuit further comprises at least one counter circuit corresponding to each at least one differential channel for counting repetitive clock cycles of the at least one clock circuit;

the digital differential value determining circuit starts a count of repetitive clock cycles based on the first-comparator output signal of a differential channel; and the digital differential value determining circuit ends the count of the repetitive clock cycles based on the second-comparator output signal of the differential channel, the digital value representative of the difference between the pair of differential signals received by that differential channel is based on the count of repetitive clock cycles; and the at least one clock circuit is controllable to start operation that provides the repetitive clock cycles at the start of periods during which the at least one digital differential value determining circuit determines the digital value representative of the difference between the pair of differential signals and to stop operation at the end of such periods.

9. A signal processing system suitable for processing transducer signals in a low power measuring instrument, the signal processing system comprising;

a reference signal generator for generating an ADC ramp signal;

two or more differential signal channels, each differential signal channel comprising:

a first comparator comprising a first input, a second input, and an output, the first input of the first comparator receiving the first signal of a pair of differential signals, the second input of the first comparator receiving the ramp signal, the output of the first comparator providing a first-comparator output signal based on the signals at the first and second inputs;

a second comparator comprising a first input, a second input, and an output, the first input of the second comparator receiving the second signal of the pair of differential signals, the second input of the second comparator receiving the ramp signal, the output of the second comparator providing a second-comparator output signal based on the signals at the first and second inputs;

one or more digital differential value determining circuits for receiving the first-comparator output signal and the second-comparator output signal of at least one of the differential signal channels and determining a digital value representative of the difference between the pair of differential signals received by the at least one differential signal channel;

wherein the signal processing system is operable from a low voltage power supply providing a voltage less than 1.75 volts to process the signals of the at least two differential signal channels in parallel and determine the corresponding digital values in parallel;

wherein at least one pair of differential signals depend on the operation of a transducer included in a low power measuring instrument which also includes the signal processing system, the low power measuring instrument operable to determine a measurement based on the digital values; and wherein the at least two differential signal channels comprise at least three differential signal channels, the transducer comprises a three-phase displacement transducer, and the at least one digital differential value determining circuit determining at least three digital values representative of the differences between at least three pairs of differential signals received by the at least three differential signal channels, the at least three digital values further processable to determine a displacement measurement which is substantially free of at least one of third harmonic spatial distortion and third harmonic signal processing distortion.

10. The signal processing system of claim 9, wherein the transducer is an inductive displacement transducer of a type such as linear, angular, or rotary.

11. The signal processing system of claim 10, wherein the low power measuring instrument is a handheld portable measuring instrument.

12. A signal processing method suitable for processing transducer signals in a low power measuring instrument, the signal processing method comprising;

generating an ADC ramp signal;

for at least one differential signal channel;

receiving the first signal of a pair of differential signals at a first input of a first comparator of the differential signal channel and receiving the ramp signal at a second input of the first comparator of the differential signal channel;

outputting a first-comparator output signal based on the signals at the first and second inputs; and receiving the second signal of a pair of differential signals at a first input of a second comparator of the differential signal channel and receiving the ramp signal at a second input of the second comparator of the differential signal channel;

outputting a second-comparator output signal based on the signals at the first and second inputs;

generating at least one clock signal based on the operation of at least one comparator wherein a trip-point voltage of the comparator and a voltage change rate of a clock ramp signal input to the comparator are both controlled based on a common signal such that normal variations in a voltage supply used to generate the clock signal do not substantially affect the clock period and wherein the clock signal is used in the step of determining a digital value; and determining a digital value representative of the difference between each pair of differential signals received by a differential signal channel based on the first-comparator output signal and the second-comparator output signal of that differential signal channel and the generated at least one clock signal.

13. The signal processing method of claim 12, wherein the generating, receiving, outputting and determining steps are performed using voltage signals which do not exceed 1.5 volts.

14. The signal processing method of claim 12, wherein the signal processing method further comprises repeating the generating, receiving, outputting and determining steps as part of the operation of a measuring instrument which is operated from a portable low power low voltage power supply and the generating, receiving, outputting and determining steps are performed using voltage signals which do not exceed the voltage provided by the portable low power low voltage power supply.

15. The signal processing method of claim 14, wherein the portable low power low voltage power supply supplies a total average current of 10 microamps or less to the portable measuring instrument during normal operation.

16. The signal processing method of claim 12, further comprising:

providing a first voltage used to generate the ADC ramp signal;

providing a second voltage proportional to the first voltage to a transducer which determines at least one pair of differential signals received by a corresponding differential signal channel;

wherein a scale factor associated with the signal processing method and the signal amplitude of the differential signals determined by the transducer change in a manner that compensates each other with regard to proportional variations in the first and second voltages, such that for a measuring instrument including the transducer and which also includes the signal processing method as part of the operation of the measuring instrument the overall measurement accuracy of the measuring instrument is substantially insensitive to normal variations in a power supply used to provide the first and second voltages.

17. The signal processing method of claim 12, the method further comprising generating repetitive clock cycles, and wherein the step of determining a digital value representative of the difference between each pair of differential signals received by a differential signal channel comprises:

starting a clock that provides repetitive clock cycles at the start of periods during which a digital value representative of the difference between a pair of differential signals received by a differential signal channel is being determined;

starting a count of the repetitive clock cycles based on the first-comparator output signal of a differential channel;

ending the count of the repetitive clock cycles based on the second-comparator output signal of the differential channel;

stopping the clock that provides repetitive clock cycles after ending the count of the repetitive clock cycles; and determining the digital value representative of the difference between the pair of differential signals received by the differential channel based on the count of repetitive clock cycles.

18. The signal processing method of claim 12, wherein at least one pair of received differential signals depend on the operation of a transducer included in a low power measuring instrument which also includes the signal processing method as part of the operation of the measuring instrument, the low power measuring instrument operable to determine a measurement based on the digital values; and the at least two differential signal channels comprising at least three differential signal channels and the transducer comprising a three-phase displacement transducer, wherein the step of determining a digital value representative of the difference between each pair of differential signals received by a differential signal channel comprises determining at least three digital values representative of the differences between at least three pairs of differential signals received by the at least three differential signal channels, the at least three digital values further processable to determine a displacement measurement which is substantially free of at least one of third harmonic spatial distortion and third harmonic signal processing distortion.

19. The signal processing method of claim 18, wherein the transducer is an inductive displacement transducer of a type such as linear, angular, or rotary.

20. The signal processing method of claim 19, wherein the low power measuring instrument is one of a portable measuring instrument and a handheld portable measuring instrument.

21. A signal processing system suitable for processing transducer signals in a low power measuring instrument, the signal processing system compnsing;

a reference signal generator for generating an ADC ramp signal;

two or more differential signal channels, each differential signal channel comprising:

a first comparator comprising a first input, a second input, and an output, the first input of the first comparator receiving the first signal of a pair of differential signals, the second input of the first comparator receiving the ramp signal, the output of the first comparator providing a first-comparator output signal based on the signals at the first and second inputs; and a second comparator comprising a first input, a second input, and an output, the first input of the second comparator receiving the second signal of the pair of differential signals, the second input of the second comparator receiving the ramp signal, the output of the second comparator providing a second-comparator output signal based on the signals at the first and second inputs;

a power supply usable to provide a first voltage level to the reference signal generator during normal operation and further usable to provide a second voltage level proportional to the first voltage level to a transducer which determines at least one pair of differential signals received by the signal processing system during normal operation; and one or more digital differential value determining circuits for receiving the first-comparator output signal and the second-comparator output signal of at least one of the differential signal channels and determining a digital value representative of the difference between the pair of differential signals received by the at least one differential signal channel, wherein:

the signal processing system is operable to process the signals of the at least two differential signal channels in parallel and determine the corresponding digital values in parallel; and a scale factor of the signal processing circuit and the signal amplitude of the differential signals determined by the transducer change in a manner that compensates each other with regard to variations in the voltage of the power supply, such that the overall measurement accuracy of a measuring instrument including the signal processing system and the transducer is substantially insensitive to variations in the voltage of the power supply during normal operation.

22. The signal processing system of claim 21, wherein the scale factor of the signal processing circuit is inversely proportional to the first voltage level and the signal amplitude of the differential signals determined by the transducer are proportional to the second voltage level.

23. The signal processing system of claim 21, wherein the at least one digital differential value determining circuit comprises at least one clock circuit; the clock circuit configured such that for at least one comparator included in the clock circuit a trip-point voltage of the comparator and a voltage change rate of a clock ramp signal input to the comparator are both controlled based on a common signal, such that variations in a voltage supplied to the clock during normal operation does not substantially affect the clock period.

24. The signal processing system of claim 23, wherein:

the clock circuit further comprises at least one resistor having a resistance that is a primary determinant of the common signal, and at least one capacitor having a capacitance that is a primary determinant of the voltage change rate of the clock ramp signal;

the reference signal generator comprises at least one resistor having a resistance that is a first primary determinant of the generated ADC ramp signal, and at least one capacitor having a capacitance that is a second primary determinant of the generated ADC ramp signal; and wherein the scale factor of the signal processing circuit is affected mainly by the resistance that is a primary determinant of the common signal, the capacitance that is a primary determinant of the voltage change rate of the clock ramp signal, the resistance that is a first primary determinant of the generated ADC ramp signal, the capacitance that is a second primary determinant of the generated ADC ramp signal, and the value of a voltage supplied to the reference signal generator during normal operation.

25. The signal processing system of claim 21, wherein the signal processing system is operable from a low voltage power supply providing a voltage equal to or less than 1.75 volts.

26. The signal processing system of claim 25, wherein the signal processing system is operable from a low voltage power supply providing a voltage equal to or less than 1.5 volts.

27. A signal processing method suitable for processing transducer signals in a low power measuring instrument, the signal processing method comprising;

providing a first voltage usable to generate an ADC ramp signal;

generating the ADC ramp signal based on the first voltage;

providing a second voltage proportional to the first voltage to a transducer which determines at least two pairs of differential signals received by a corresponding differential signal channel;

for each of at least two corresponding differential signal channels;

receiving the first signal of a pair of differential signals at a first input of a first comparator of the differential signal channel and receiving the ramp signal at a second input of the first comparator of the differential signal channel;

outputting a first-comparator output signal based on the signals at the first and second inputs of the first comparator; and receiving the second signal of a pair of differential signals at a first input of a second comparator of the differential signal channel and receiving the ramp signal at a second input of the second comparator of the differential signal channel;

outputting a second-comparator output signal based on the signals at the first and second inputs of the second comparator; and determining a digital value representative of the difference between each pair of differential signals received by a differential signal channel based on the first-comparator output signal and the second-comparator output signal of that differential signal channel, wherein:

the providing a first voltage, generating, providing a second voltage, receiving, outputting and determining steps are performed to determine the digital values corresponding to each differential channel in parallel, and a scale factor associated with the signal processing method and the signal amplitude of the differential signals determined by the transducer change in a manner that compensates each other with regard to proportional variations in the first and second voltages, such that for a measuring instrument including the transducer and which also includes the signal processing method as part of the operation of the measuring instrument the overall measurement accuracy of the measuring instrument is substantially insensitive to normal variations in a power supply used to provide the first and second voltages.

28. The signal processing method of claim 27, wherein the generating, receiving, outputting and determining steps are performed using voltage signals which do not exceed 1.75 volts.

29. The signal processing method of claim 28, wherein the generating, receiving, outputting and determining steps are performed using voltage signals which do not exceed 1.5 volts.

* * * * *